US012720898B2

(12) United States Patent
Hong et al.

(10) Patent No.: US 12,720,898 B2
(45) Date of Patent: Aug. 25, 2026

(54) SEMICONDUCTOR CAPACITOR FOR STACKED PIXEL

(71) Applicant: Taiwan Semiconductor Manufacturing Company, Ltd., Hsinchu (TW)

(72) Inventors: Shen-Hui Hong, Tainan City (TW); Chun-Chieh Chuang, Tainan City (TW); Feng-Chi Hung, Chu-Bei City (TW); Jen-Cheng Liu, Hsin-Chu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 361 days.

(21) Appl. No.: 18/490,246

(22) Filed: Oct. 19, 2023

(65) Prior Publication Data

US 2025/0133856 A1 Apr. 24, 2025

(51) Int. Cl.

*H10F 39/00* (2025.01)
*H10W 72/90* (2026.01)
*H10W 90/00* (2026.01)

(52) U.S. Cl.

CPC ......... *H10F 39/809* (2025.01); *H10F 39/014* (2025.01); *H10F 39/018* (2025.01); *H10F 39/811* (2025.01); *H10W 72/952* (2026.01); *H10W 72/953* (2026.01); *H10W 90/792* (2026.01)

(58) Field of Classification Search

CPC ........................................................ H10F 39/00
See application file for complete search history.

(56) References Cited

U.S. PATENT DOCUMENTS

| | | | |
|---|---|---|---|
| 10,608,101 | B2 | 3/2020 | Liu |
| 11,888,007 | B2 | 1/2024 | Kadura et al. |
| 2018/0084164 | A1 | 3/2018 | Hynecek et al. |
| 2022/0293647 | A1 | 9/2022 | Chou et al. |
| 2022/0360728 | A1 | 11/2022 | Johnson |

*Primary Examiner* — Anthony Ho

(74) *Attorney, Agent, or Firm* — Eschweiler & Potashnik, LLC

(57) ABSTRACT

Various embodiments of the present disclosure are directed towards an image sensor including a first integrated circuit (IC) die stacked with a second IC die. The first IC die includes a plurality of photodetectors disposed within a first substrate. The second IC die includes a plurality of pixel transistors and a semiconductor capacitor disposed on a second substrate. The semiconductor capacitor includes a first capacitor electrode, a capacitor dielectric layer, and a doped capacitor region. The first capacitor electrode overlies the second substrate and comprises a protrusion disposed in the second substrate. The capacitor dielectric layer is disposed between the first capacitor electrode and the second substrate. The doped capacitor region is disposed within the second substrate and underlies the first capacitor electrode. The plurality of photodetectors, the plurality of pixel transistors, and the semiconductor capacitor define a pixel.

20 Claims, 22 Drawing Sheets

SEMICONDUCTOR CAPACITOR FOR STACKED PIXEL

BACKGROUND

Integrated circuits (ICs) with image sensors are used in a wide range of modern-day electronic devices, such as, for example, cameras, cell phones, and the like. Types of image sensors include, for example, complementary metal-oxide semiconductor (CMOS) image sensors and charge-coupled device (CCD) image sensors. Compared to CCD image sensors, CMOS image sensors are increasingly favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
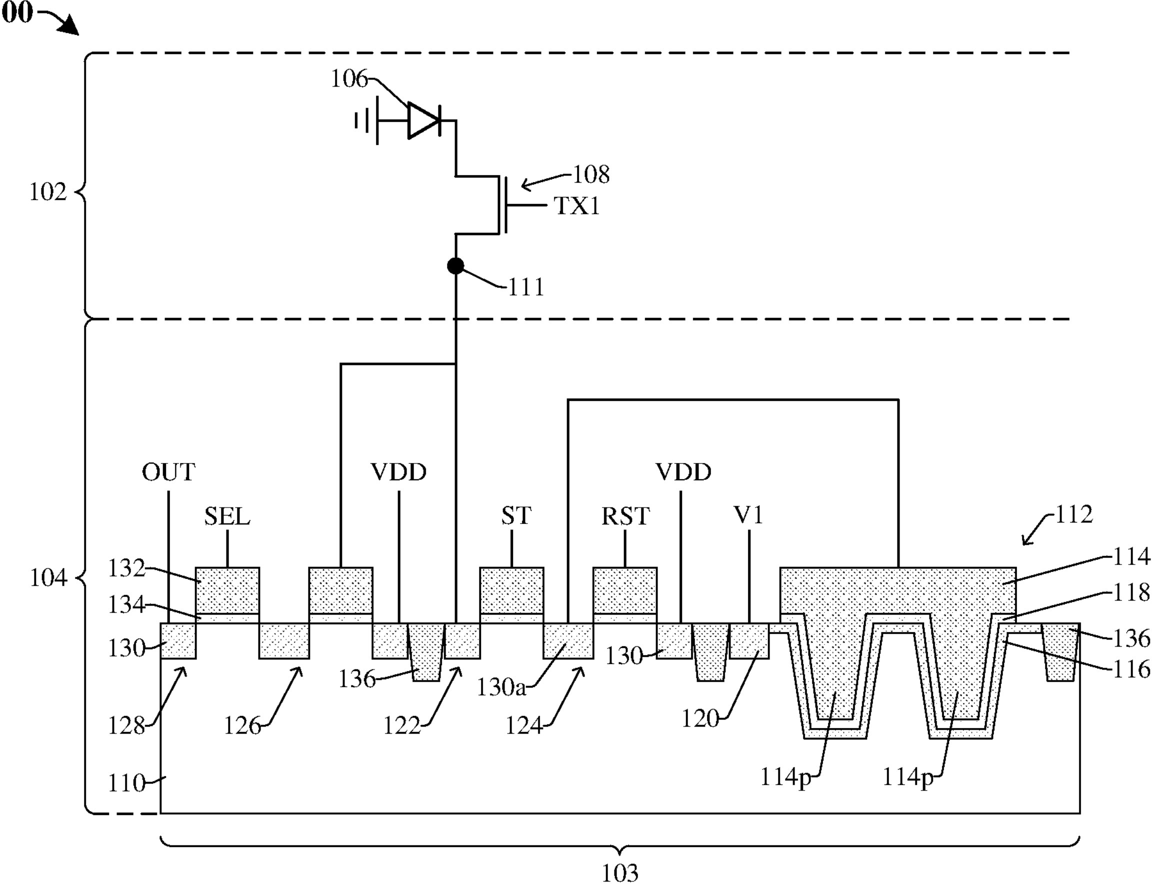
FIG. 1 illustrates a schematic view of some embodiments of an image sensor comprising a pixel disposed across a first integrated circuit (IC) die and a second IC die and a semiconductor capacitor disposed within the second IC die.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An image sensor may comprise a first integrated circuit (IC) die and a second IC die that are stacked. The first IC die comprises a plurality of pixels and the second IC die comprises an application-specific IC (ASIC) electrically coupled to each pixel. The pixels respectively include a plurality of photodetectors disposed in first substrate of the first IC die. The pixels further include a plurality of semiconductor devices configured to conduct readout of the photodetectors. The semiconductor devices include a plurality of transfer transistors, a plurality of pixel transistors, and a capacitor. An interconnect structure of the first IC die comprises a plurality of metal wires and a plurality of metal vias disposed on the first substrate and configured to electrically couple the semiconductor devices to one another. The capacitor may be configured as a metal-insulator-metal capacitor and is disposed within the interconnect structure of the first IC die. The capacitor is configured to increase a performance of the pixel. For example, the capacitor is configured to increase the full well capacitor (FWC) of the photodetectors.

In an effort to further increase the FWC of the photodetectors, a capacitance of the capacitor may be increased. The capacitance of the capacitor may be increased by increasing a lateral area of a first metal plate and a second metal plate of the capacitor. However, increasing the lateral area of the first and second metal plates decreases an area available in the interconnect structure for metal routing. In another example, the first and second metal plates may be disposed within a trench of a dielectric structure of the interconnect structure to increase and area between the first and second metal plates. This decreases an area for metal routing, leads to complicated metal routing designs, and/or increases fabrication costs. Decreasing the area available for metal routing in the interconnect structure mitigates an ability to scale a size of the image sensor and decreases device density.

Various embodiments of the present application are directed towards an image sensor comprising a pixel having a semiconductor capacitor with increased capacitance and simplified fabrication. The pixel spans a first IC die and a second IC die stacked with the first IC die. The pixel comprises a plurality of photodetectors and a plurality of transfer transistors disposed within and/or on a first substrate of the first IC die. Further, the pixel comprises a plurality of pixel transistors (e.g., reset transistor(s), source-follower transistor(s), etc.) disposed on a second substrate of the second IC die. The first and second IC dies respectively comprise an interconnect structure configured to electrically couple the first and second IC dies together and facilitate electrical routing. The semiconductor capacitor comprises a doped capacitor region in the second substrate, a capacitor dielectric layer along the second substrate, and a first capacitor electrode overlying the doped capacitor region. Disposing the semiconductor capacitor within/along the second substrate increases an area in the interconnect structures of the first and/or second IC dies for metal routing, thereby decreasing metal routing design complexity, decreasing fabrication costs, and facilitating device scaling. Further, the first capacitor electrode comprises one or more protrusions disposed in a trench of the second substrate. This facilitates increasing an area between the first capacitor electrode and the doped capacitor region without increasing a lateral area of the semiconductor capacitor. Accordingly, a capacitance of the semiconductor capacitor can be increased without reducing an area for the pixel transistors. Thus, disposing the semiconductor capacitor on the second substrate of the second IC die increases an overall performance of the image sensor.

FIG. 1 illustrates a schematic view 100 of some embodiments of an image sensor comprising a pixel 103 having a semiconductor capacitor 112 disposed within a second IC die 104.

The pixel 103 spans a first IC die 102 and the second IC die 104. The first IC die 102 is represented by a circuit diagram and the second IC die 104 is represented by a cross-sectional view. The pixel 103 comprises a photodetector 106 and a transfer transistor 108 at the first IC die 102. In some embodiments, the photodetector 106 is disposed within a first substrate (not shown) of the first IC die 102 and a floating diffusion node 111 is disposed within the first substrate. The pixel 103 further comprises a plurality of pixel transistors 122-128 and a semiconductor capacitor 112 disposed on a second substrate 110 of the second IC die 104. The transfer transistor 108, the plurality of pixel transistors 122-128, and the semiconductor capacitor 112 are configured to collectively facilitate readout of the photodetector 106. Because the pixel 103 is split across the first IC die 102 and the second IC die 104, an area of the first IC die 102 that would otherwise be used by the plurality pixel transistors 122-128 may be used by the photodetector 106. This facilitates increasing a size of the photodetector 106 and/or increasing a number of photodetectors that may be disposed across the first IC die 102, thereby increasing a performance of the pixel 103 (e.g., increasing FWC) and/or increasing device density.

The photodetector 106 is configured to absorb incident light (e.g., photons) and generate respective electrical signals corresponding to the incident light. For example, the photodetector 106 may generate electron-hole pairs from the incident light. The transfer transistor 108 is gated by a transfer signal TX1 and is configured to control current flow between the floating diffusion node 111 and the photodetector 106. For example, the transfer transistor 108 may be configured to selectively form a conductive channel in the first substrate between the floating diffusion node 111 and the photodetector 106 to transfer accumulated charge in the photodetector 106 to the floating diffusion node 111. The pixel transistors 122-128 are configured to conduct readout of the transferred accumulated charge from the floating diffusion node 111.

The plurality of pixel transistors 122-128 comprise a first transistor 122, a reset transistor 124, a source-follower transistor 126, and a select transistor 128. The plurality of pixel transistors 122-128 respectively comprise a gate electrode 132 stacked with a gate dielectric layer 134 over the second substrate 110 and source/drain regions 130 disposed within the second substrate 110. Source/drain region(s) may refer to a source or a drain, individually or collectively depending upon the context.

The reset transistor 124 is electrically coupled between the floating diffusion node 111 and a terminal at which a supply voltage VDD is applied. The first transistor 122 is electrically coupled between the floating diffusion node and the reset transistor 124. The reset transistor 124 is gated by a reset signal RST and is configured to selectively electrically couple the floating diffusion node 111 to the supply voltage VDD. Thus, the reset transistor 124 is configured to reset the floating diffusion node 111 to the supply voltage VDD through coordination with the first transistor 122. In addition, the reset transistor 124 may be configured to selectively couple the photodetector 106 to the supply voltage VDD through coordination with the first transistor 122 and the transfer transistor 108, thereby clearing accumulated charge at the photodetector 106.

The source-follower transistor 126 is electrically coupled between the supply voltage VDD and the select transistor 128. The source-follower transistor 126 is gated by a charge at the floating diffusion node 111. For example, the gate electrode 132 of the source-follower transistor 126 is directly electrically coupled to the floating diffusion node 111. The select transistor 128 is electrically coupled between the source-follower transistor 126 and an output terminal OUT of the second IC die 104. Accordingly, the source-follower transistor 126 and the select transistor 128 are electrically coupled in series from the supply voltage VDD to the output terminal OUT. The source-follower transistor 126 is configured to buffer and/or amplify a voltage at the floating diffusion node 111 for non-destructive reading of the voltage. The select transistor 128 is gated by a select signal SEL and is configured to selectively pass the buffered and/or amplified voltage from the source-follower transistor 126 to the output terminal OUT. This buffered and/or amplified voltage is then passed to another IC die (e.g., an ASIC circuit) for downstream signal processing.

The semiconductor capacitor 112 comprises a first capacitor electrode 114, a capacitor dielectric layer 118, a doped capacitor region 116, and a capacitor contact region 120. The first capacitor electrode 114 comprises a plurality of protrusions disposed within trenches extending into the second substrate 110. In various embodiments, the doped capacitor region 116 is a doped region of the second substrate 110. The second substrate 110 comprises a first doping type (e.g., p-type) and the doped capacitor region 116 comprises a second doping type (e.g., n-type) opposite the first doping type. The capacitor dielectric layer 118 lines the trenches of the second substrate 110 and is disposed between the first capacitor electrode 114 and the doped capacitor region 116. Further, the capacitor contact region 120 is a doped region of the second substrate 110 comprising the second doping type (e.g., n-type) and is electrically coupled to the doped capacitor region 116. The semiconductor capacitor 112 is electrically coupled between a first voltage supply V1 and a shared source/drain region 130*a* of the first transistor 122 and the reset transistor 124.

The first transistor 122 is gated by a gate signal ST and is configured to selectively electrically couple the photodetector 106 to the semiconductor capacitor 112 through coordination with the transfer transistor 108. During an exposure period of the image sensor, the photodetector 106 absorbs incident light and accumulates charge in the photodetector 106. However, in high intensity light environments, the photodetector 106 may become saturated before the exposure period ends and is unable to accumulate enough charge to accurately reflect the high intensity of light the photodetector 106 was exposed to during the exposure period. This, in part, may result in blooming across the image sensor and/or decrease accuracy of an image produced from the image sensor. The first transistor 122 and the transfer transistor 108 are configured to transfer excess charge accumulated in the photodetector 106 to the semiconductor capacitor 112 during the exposure period. As a result, when the image sensor is exposed to high intensity light environments, overflow charge (e.g., charge accumulated past the saturation level of the photodetector 106) is transferred to the semiconductor capacitor 112. The charge accumulated at the semiconductor capacitor 112 may be readout by the source-follower transistor 126 and select transistor 128. Accordingly, the semiconductor capacitor 112 increases the FWC of the pixel 103 and decreases negative performance from blooming (e.g., cross-talk between photodetectors across the image sensor).

Figure 3:
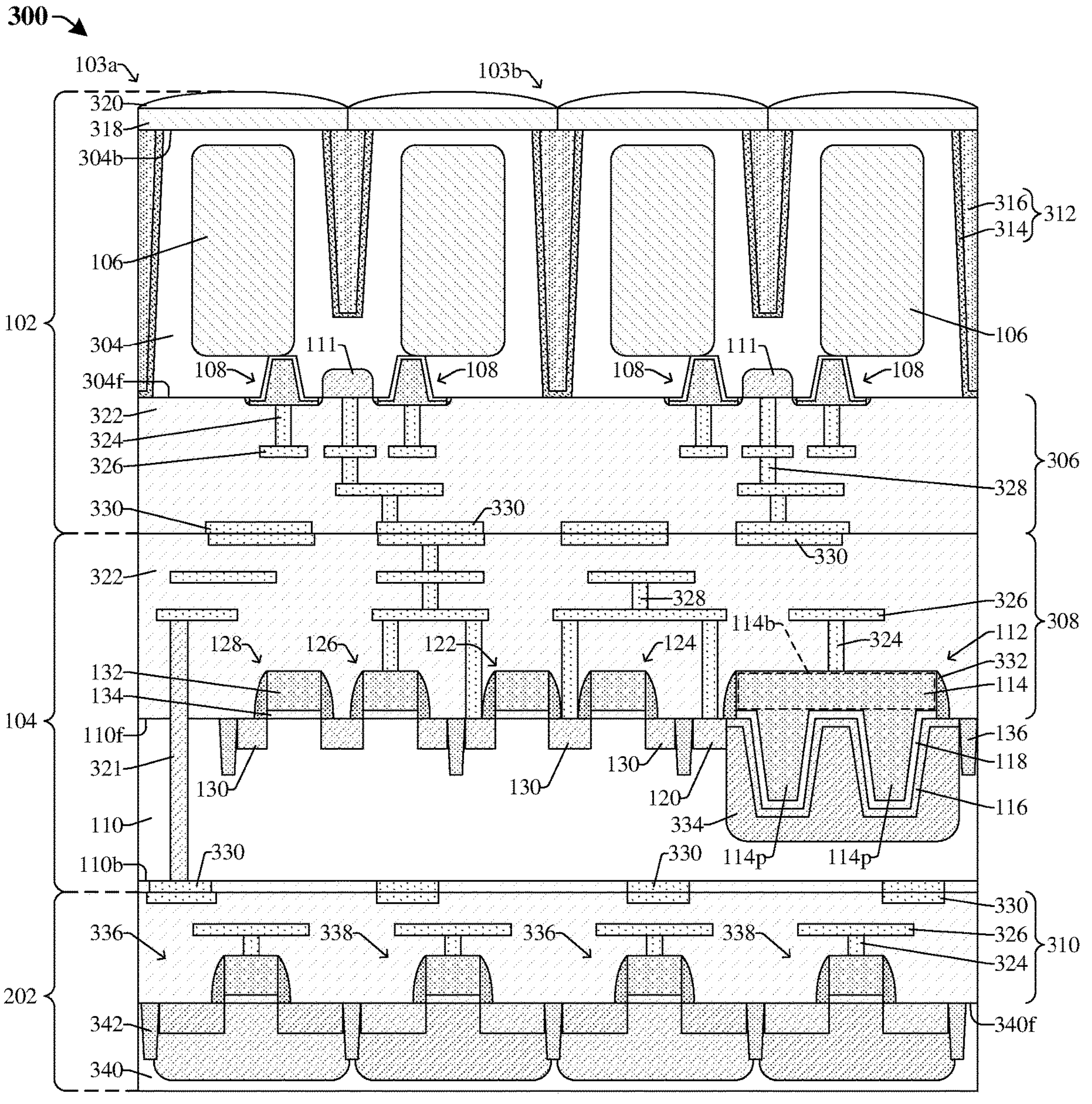
FIG. 3 illustrates a cross-sectional view of some embodiments of an image sensor having a first IC die, a second IC die, and a third IC die vertically stacked with one another, where the second IC die comprises a semiconductor capacitor.

The first and second IC dies 102, 104 are electrically coupled to one another by corresponding interconnect structures (e.g., as illustrated in FIG. 3). By virtue of the semiconductor capacitor 112 being disposed on and/or within the second substrate 110, the semiconductor capacitor 112 is not disposed within the interconnect structure of the first or second IC dies 102, 104. This increases an area in the interconnect structures of the first and/or second IC dies 102, 104 for metal routing, thereby decreasing metal routing design complexity, decreasing fabrication costs, and facilitating device scaling. Further, the first capacitor electrode 114 comprising protrusions 114*p* disposed in the second substrate 110 increases an area between the first capacitor electrode 114 and the doped capacitor region 116 in a vertical direction. This facilitates increasing the capacitance of the semiconductor capacitor 112 while maintaining or decreasing a lateral footprint of the semiconductor capacitor 112. Increasing the capacitance of the semiconductor capacitor 112 increasing the performance (e.g., FWC) of the pixel 103. Therefore, disposing the semiconductor capacitor 112 on the second substrate 110 of the second IC die 104 increases an overall performance of the image sensor.

Figure 2:
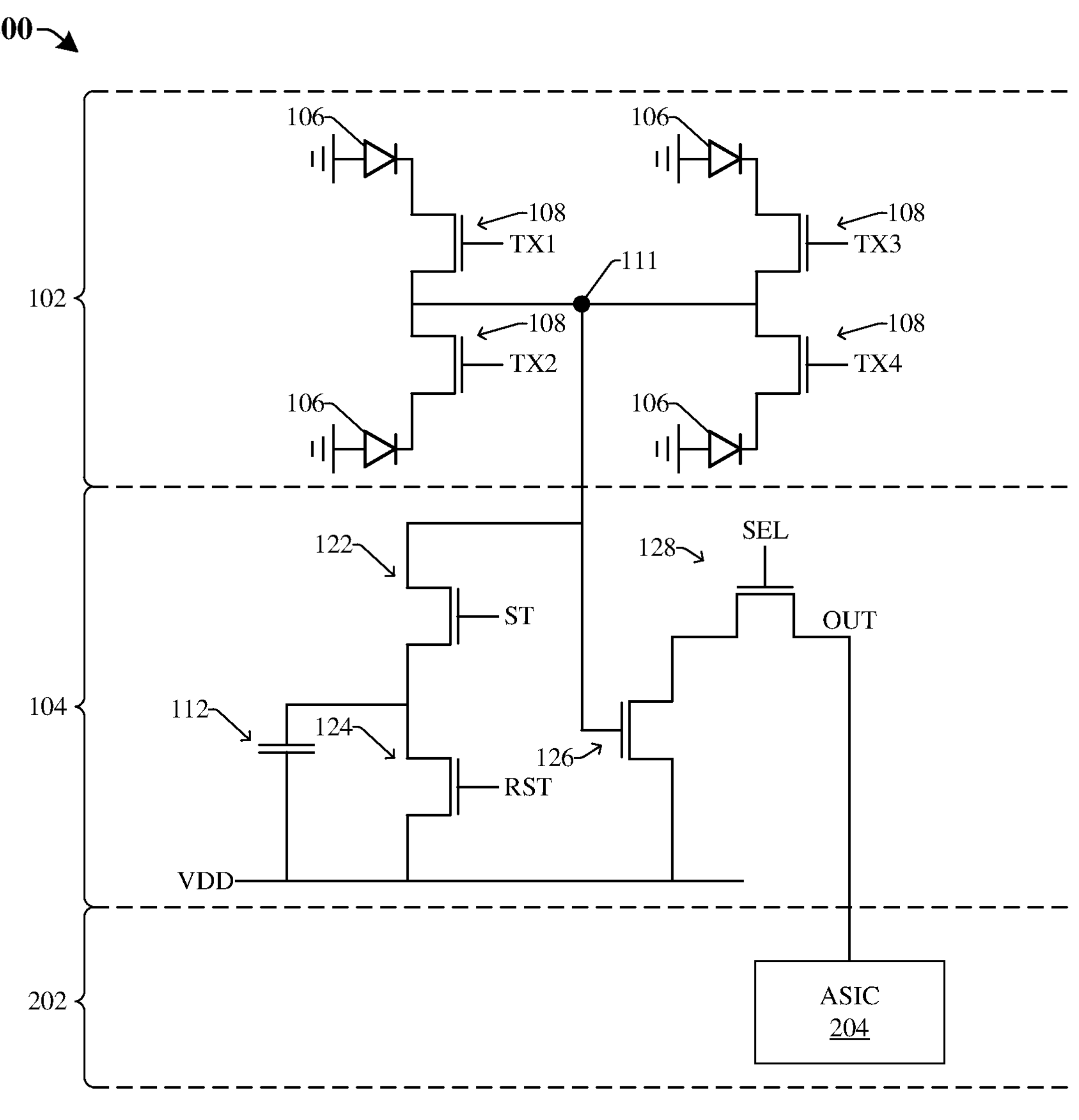
FIG. 2 illustrates a circuit diagram of some embodiments of the image sensor of FIG. 1, where the image sensor further comprises a third IC die electrically coupled to the second IC die.

FIG. 2 illustrates a circuit diagram 200 of some other embodiments of the image sensor of FIG. 1, where the image sensor further comprises a third IC die 202 electrically coupled to the second IC die 104. The third IC die 202 comprises an ASIC 204 electrically coupled to the output terminal OUT of the second IC die 104. In some embodiments, the first IC die 102 comprises a plurality of photodetectors 106 and a plurality of transfer transistors 108 electrically coupled between a respective photodetector 106 and the floating diffusion node 111. The plurality of transfer transistors 108 are gated by transfer signals TX1-TX4. In various embodiments, the semiconductor capacitor 112 is electrically coupled between the supply voltage VDD and a shared source/drain region of the first transistor 122 and the reset transistor 124. In further embodiments, the photodetectors 106 are electrically coupled between a ground terminal and a corresponding source/drain region of the plurality of transfer transistors. The semiconductor capacitor 112 is configured to increase the FWC of the plurality of photodetectors 106, thereby increasing an overall performance of the image sensor.

FIG. 3 illustrates a cross-sectional view 300 of some embodiments of an image sensor having a first IC die 102, a second IC die 104, and a third IC die vertically stacked with one another, where the second IC die 104 comprises a semiconductor capacitor 112. A plurality of pixels 103*a*, 103*b* span the first and second IC dies 102, 104.

The first IC die 102 comprises a first interconnect structure 306 disposed on a front-side surface 304*f* of a first substrate 304 and a plurality of photodetectors 106 disposed within the first substrate 304. The first substrate 304 may, for example, be or comprise silicon, monocrystalline silicon, germanium, silicon germanium, or another suitable semiconductor material. The first substrate 304 has a first doping type (e.g., p-type). The plurality of photodetectors 106 are or comprise a doped region of the first substrate 304 having a second doping type (e.g., n-type) opposite the first doping type. The plurality of photodetectors 106 may be configured as photodiodes or some other suitable photodetector. A plurality of floating diffusion nodes 111 are disposed in the first substrate 304 and are adjacent to corresponding photodetectors 106. The floating diffusions node comprises the second doping type (e.g., n-type). In various embodiments, the pixels 103*a*, 103*b* respectively comprise photodetectors 106 disposed in a 2×2 layout, a 2×1 layout, or some other suitable layout.

A plurality of transfer transistors 108 are disposed on the front-side surface 304*f* of the first substrate 304 and are each adjacent to a corresponding photodetector 106. The transfer transistors 108 comprise a transfer gate electrode and a transfer gate dielectric between the transfer gate electrode and the first substrate 304. A trench isolation structure 312 extends into a back-side surface of the first substrate 304. The trench isolation structure 312 comprises a trench fill layer 316 and a liner layer 314. The liner layer 314 is disposed between the trench fill layer 316. The trench isolation structure 312 laterally wraps around the photodetectors 106 and is configured to provide electrical and optical isolation between adjacent photodetectors 106 and between adjacent pixels in the plurality of pixels 103*a-b*. A plurality of light filters 318 are disposed on the back-side surface 304*b* of the first substrate 304 overlying the photodetectors 106. A plurality of micro-lenses 320 are disposed on the light filters 318 and are configured to focus incident light towards the photodetectors 106.

The second IC die 104 underlies the first IC die 102. The second IC die 104 comprises a second substrate 110, a second interconnect structure 308 on a front-side surface 110*f* of the second substrate 110, a plurality of pixel transistors 122-128 on the second substrate 110, and a semiconductor capacitor 112. The second substrate 110 may, for example, be or comprise silicon, monocrystalline silicon, germanium, silicon germanium, or some other suitable semiconductor material. The second substrate 110 has the first doping (e.g., p-type). The first interconnect structure 306 of the first IC die 102 and the second interconnect structure 308 of the second IC die 104 meet a first bond interface that comprises metal-to-metal bonds and dielectric-to-dielectric bonds. The first and second interconnect structures 306, 308 respectively comprise a plurality of conductive contacts 324, a plurality of conductive wires 326, a plurality of conductive vias 328, and a plurality of bond pads 330 disposed within a dielectric structure 322. The first and second interconnect structures 306, 308 are configured to facilitate electrical coupling between the first and second IC dies 102, 104.

The plurality of pixel transistors 122-128 respectively comprise a gate electrode 132, a gate dielectric layer 134 disposed between the gate electrode 132 and the second substrate 110, a plurality of source/drain regions 130 disposed on opposing sides of the gate electrode 132, and a sidewall spacer structure 332 disposed along sidewalls of the gate electrode 132. The plurality of source/drain regions 130 are disposed within the second substrate 110 and comprise the second doping type (e.g., n-type). An isolation structure 136 extends into the front-side surface 110*f* of the second substrate 110 and is configured to facilitate electrical isolation between the plurality of pixel transistors 122-128 and the semiconductor capacitor 112. The plurality of pixel transistors 122-128 comprise a first transistor 122, a reset transistor 124, a source-follower transistor 126, and a select transistor 128.

The semiconductor capacitor 112 comprises a first capacitor electrode 114, a capacitor dielectric layer 118, a doped capacitor region 116, and a capacitor contact region 120. A plurality of trenches extend into the front-side surface 110*f* of the second substrate 110 and are defined by opposing sidewalls and a lower surface of the second substrate 110. The first capacitor electrode 114 comprises a body structure 114*b* overlying the second substrate 110 and a plurality of protrusions 114*p* extending from the body structure 114*b* into the plurality of trenches. The capacitor dielectric layer 118 is disposed between the first capacitor electrode 114 and the second substrate 110. The capacitor dielectric layer 118 directly contacts the opposing sidewalls and lower surface of the second substrate 110 that define the trenches. In various embodiments, outer sidewalls of the capacitor dielectric layer 118 are aligned with outer sidewalls of the body structure 114*b*. A sidewall spacer structure 332 continuously extends along the outer sidewalls of the capacitor dielectric layer 118 and the body structure 114*b*.

In various embodiments, the doped capacitor region 116 is a doped region of the second substrate 110 and comprises the second doping type (e.g., n-type). The doped capacitor region 116 continuously laterally wraps around outer perimeters of each of the protrusions 114*p* of the first capacitor electrode 114. The doped capacitor region 116 extends along the opposing sidewalls and lower surface of the second substrate 110 that define the trenches. In yet further embodiments, the doped capacitor region 116 is a doped epitaxial layer extending along the opposing sidewalls and lower surface of the second substrate 110 that define the trenches. The capacitor contact region 120 is disposed within the second substrate 110 and abuts the doped capacitor region 116. In various embodiments, the capacitor contact region 120 and the source/drain regions 130 have a same doping concentration. In further embodiments, a doping concentration of the doped capacitor region 116 is less than that of the capacitor contact region 120.

By virtue of the first capacitor electrode 114 comprising the protrusions 114*p* disposed in the second substrate 110, an area between the first capacitor electrode 114 and the doped capacitor region 116 is greater than a lateral footprint of the semiconductor capacitor 112. For instance, disposing the protrusions 114*p* in the trenches of the second substrate 110 increases an area between the first capacitor electrode 114 and the doped capacitor region 116 in a vertical direction. This facilitates increasing a capacitance of the semiconductor capacitor 112 without increasing the lateral footprint of the semiconductor capacitor 112. As a result, a performance (e.g., FWC) of the photodetectors 106 is increased. Further, the semiconductor capacitor 112 being disposed on the second substrate 110 increases an area for electrical routing in the first and second interconnect structures 306, 308 and decreased a design complexity of the first and second interconnect structures 306, 308. Therefore, the image sensor comprising the semiconductor capacitor 112 increases the performance (e.g., FWC) of the photodetectors 106, increases device density, and decreases design complexity.

A well region 334 is disposed within the second substrate 110 and extends along the doped capacitor region 116. The well region 334 comprises the first doping type (e.g., p-type). In some embodiments, the well region 334 has a doping concentration less than that of the doped capacitor region 116. A plurality of bond pads 330 are disposed on a back-side surface 110*b* of the second substrate 110. Further, a through substrate via (TSV) 321 continuously extends through the second substrate 110 to electrically couple the third IC die 202 to the second interconnect structure 308.

In some embodiments, a top surface of the first capacitor electrode 114 is aligned with a top surface of the gate electrodes 132 of the plurality of pixel transistors 122-128. In further embodiments, a thickness of the gate dielectric layer 134 is equal to a thickness of the capacitor dielectric layer 118. In such embodiments, a top surface of the gate dielectric layer 134 is aligned with a top surface of the capacitor dielectric layer 118 and the gate dielectric layer 134 and the capacitor dielectric layer 118 comprise a same material. In yet further embodiments, the thickness of the gate dielectric layer 134 is greater than the thickness of the capacitor dielectric layer 118. In further embodiments, the gate electrodes 132 and the first capacitor electrode 114 may be or comprise polysilicon, doped polysilicon, a metal (e.g., aluminum, titanium, etc.) some other conductive material, or any combination of the foregoing. In some embodiments, the gate electrodes 132 and the first capacitor electrode 114 comprise a same conductive material (e.g., doped polysilicon). In yet further embodiments, the gate dielectric layer 134 and the capacitor dielectric layer 118 may be or comprise silicon dioxide, hafnium oxide, zirconium oxide, aluminum oxide, some other dielectric, or any combination of the foregoing.

The third IC die 202 comprises a third substrate 340, a third interconnect structure 310, and a plurality of semiconductor devices 336, 338. The plurality of semiconductor devices 336, 338 are disposed on a front-side surface 340*f* of the third substrate 340. An isolation structure 342 is disposed in the third substrate 340 between adjacent semiconductor devices 336, 338. The third interconnect structure 310 is disposed on the front-side surface 340*f* of the third substrate 340 and is electrically coupled to the plurality of semiconductor devices 336, 338. The third interconnect structure 310 of the third IC die 202 meets the second IC die 104 at a second bond interface comprising metal-to-metal bonds, dielectric-to-dielectric bonds, or the like.

In various embodiments, the third IC die 202 is configured as an ASIC. In various embodiments, the plurality of semiconductor devices 336, 338 comprise n-channel metal-oxide-semiconductor (NMOS) transistors 336 and p-channel metal-oxide-semiconductor transistors 338. In various embodiments, the plurality of semiconductor devices 336, 338 and the plurality of pixel transistors 122-128 may, for examples, be metal-oxide-semiconductor field-effector transistors (MOSFETs), fin field-effect transistors (FinFETs), gate-all-around field-effect transistors (GAA FETs), nanosheet field-effect transistors, the like, or any combination of the foregoing.

In various embodiments, the conductive contacts 324, the conductive wires 326, the conductive vias 328, and the bond pads 330 may, for example, be or comprise copper, aluminum, tungsten, titanium, titanium nitride, tantalum nitride, some other suitable conductive material, or any combination of the foregoing. The dielectric structure 322 comprise one or more dielectric layers that may, for example, be or comprise silicon dioxide, a low-k dielectric material, silicon nitride, silicon carbide, or some other suitable dielectric material. As used herein, a low-k dielectric material is a dielectric material having a dielectric constant less than 3.9.

Figure 4:
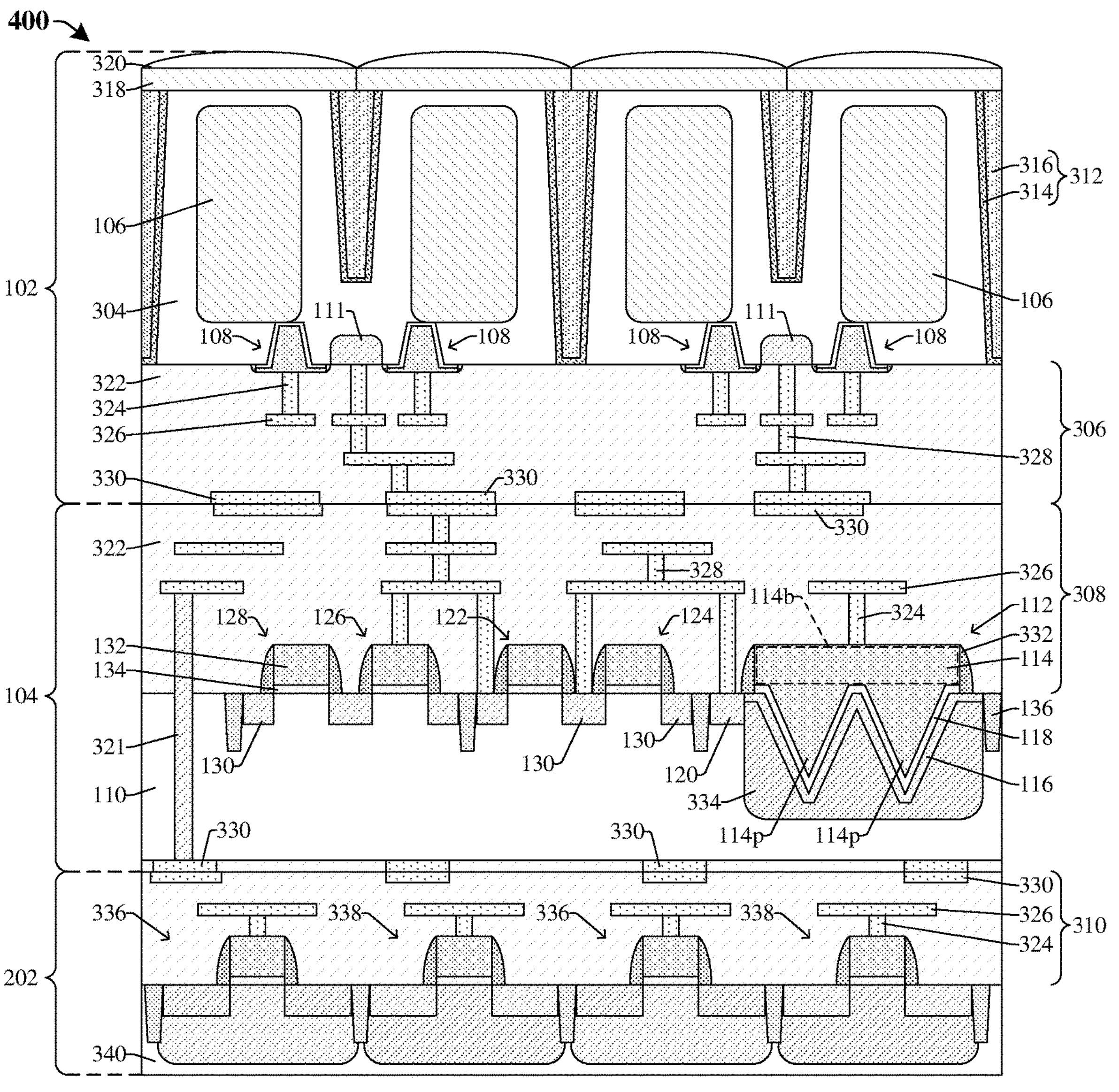
FIGS. 4-7 illustrate cross-sectional views of some other embodiments of the image sensor of FIG. 3.

FIG. 4 illustrates a cross-sectional view 400 of other embodiments of the image sensor of FIG. 3, where the plurality of protrusions 114*p* of the first capacitor electrode 114 have a triangular shape.

Figure 5:
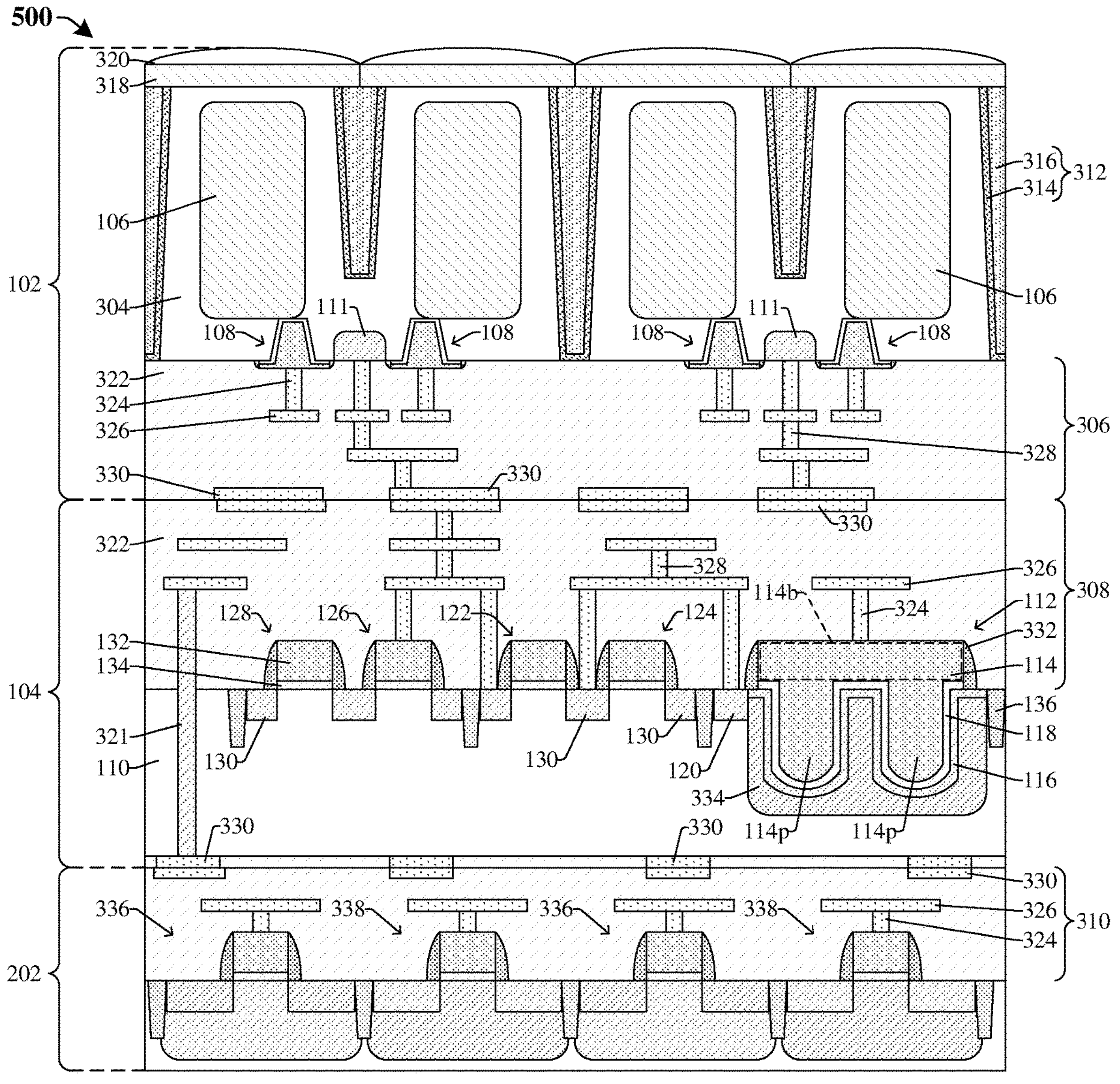

FIG. 5 illustrates a cross-sectional view 500 of further embodiments of the image sensor of FIG. 3, where the plurality of protrusions 114*p* of the first capacitor electrode 114 have a cylindrical shape. In various embodiments, bottom surfaces of the protrusions 114*p* are curved.

Figure 6:
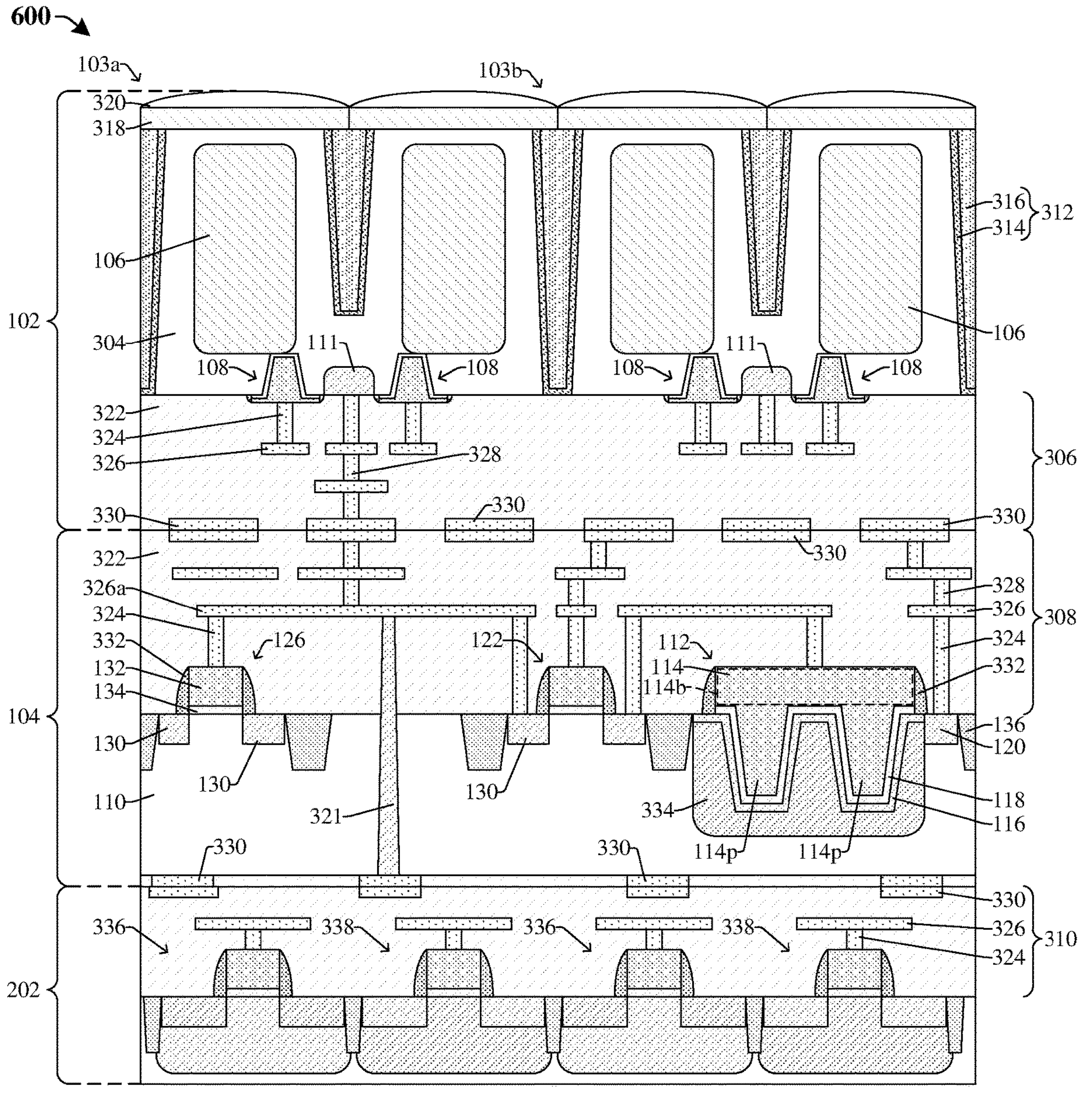

FIG. 6 illustrates a cross-sectional view 600 of some other embodiments of the image sensor of FIG. 3, where the first capacitor electrode 114 is directly electrically coupled to a source/drain region 130 of the first transistor 122. In various embodiments, the reset transistor (124 of FIG. 3) and the select transistor (128 of FIG. 3) are disposed on the second substrate 110 in a location out of view of the cross-sectional view 600 of FIG. 6. The capacitor contact region 120 is directly electrically coupled to the first interconnect structure 306 of the first IC die 102. The TSV 321 is directly electrically coupled to a first conductive wire 326*a*. The first conductive wire 326*a* is directly electrically coupled to the gate electrode 132 of the source-follower transistor 126 and a source/drain region 130 of the first transistor 122. Further, the first conductive wire 326*a* is directly electrically coupled to the floating diffusion node 111 of the first pixel 103*a*.

Figure 7:
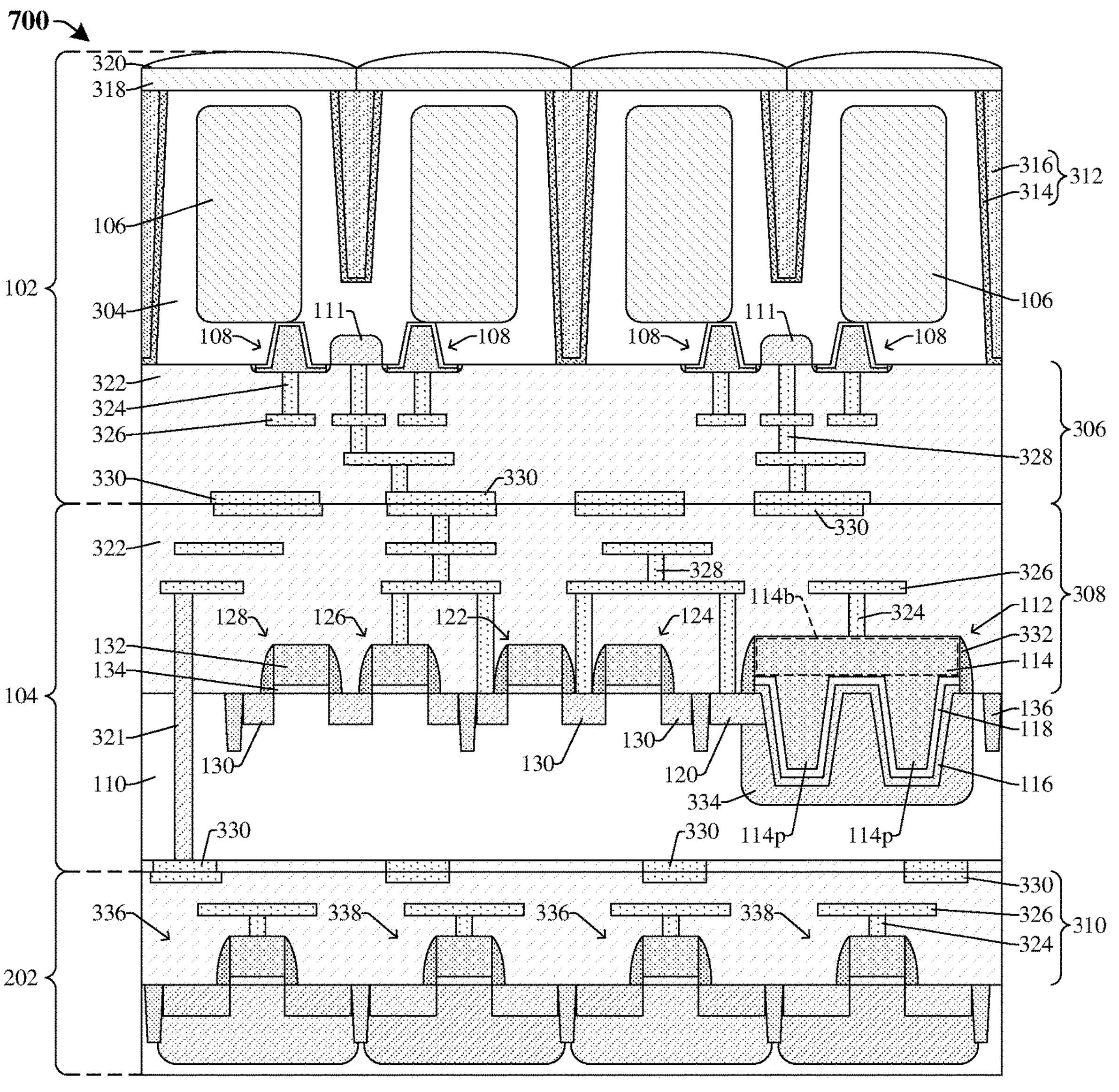

FIG. 7 illustrates a cross-sectional view 700 of further embodiments of the image sensor of FIG. 3, where the doped capacitor region 116 is or comprises a doped epitaxial layer lining trenches of the second substrate 110. In various embodiments, the doped capacitor region 116 comprises epitaxial silicon having the second doping type (e.g., n-type). In some embodiments, a thickness of the doped capacitor region 116 is greater than a thickness of the capacitor dielectric layer 118. The capacitor contact region 120 is disposed within the second substrate 110 and is disposed along a sidewall and lower surface of the doped capacitor region 116.

Figures 8A, 8B, 9A, 9B, 10A, 10B:
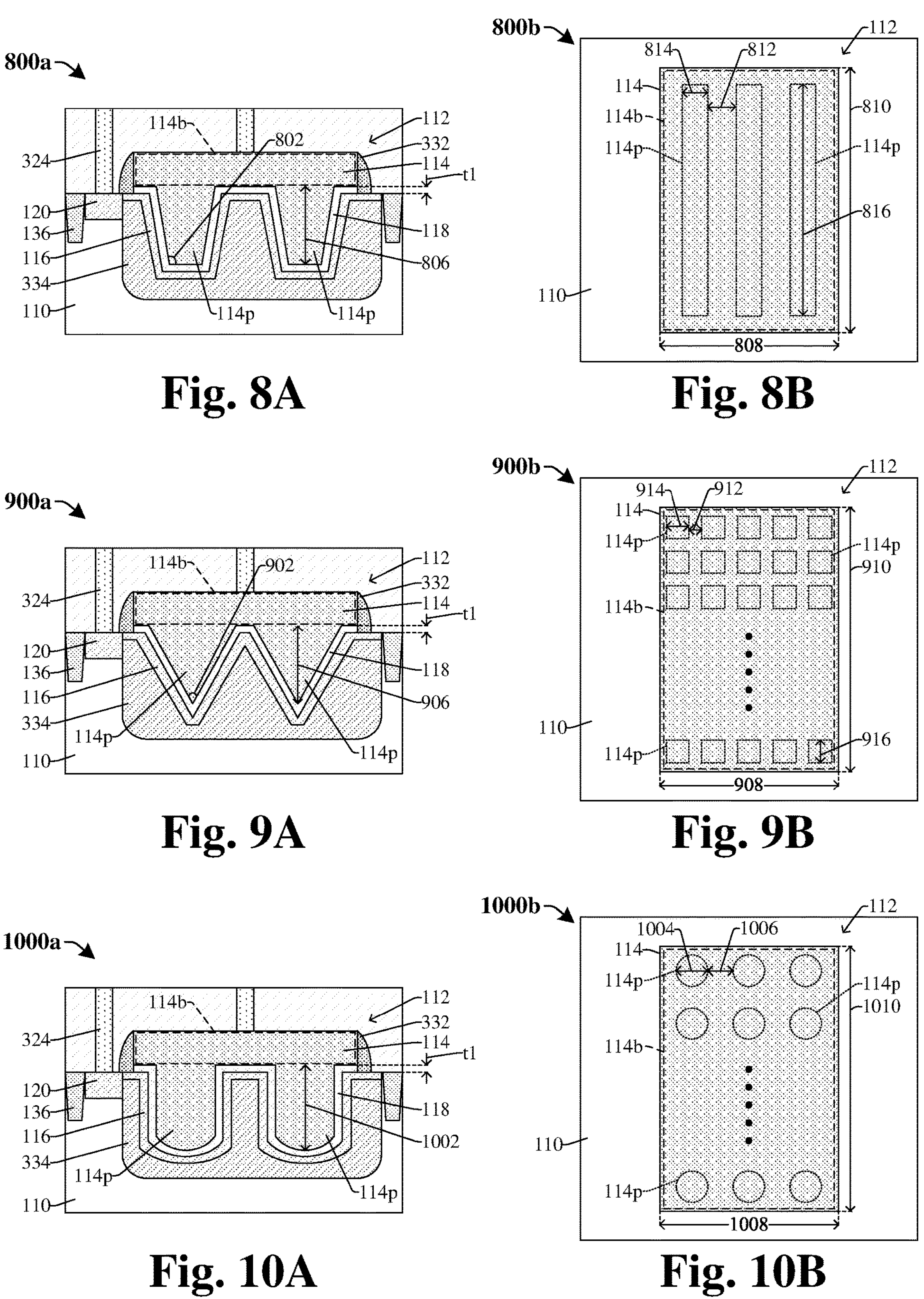
FIGS. 8A and 8B illustrate a cross-sectional view and a top view of some embodiments of the semiconductor capacitor of FIG. 3.
FIGS. 9A and 9B illustrate a cross-sectional view and a top view of some embodiments of the semiconductor capacitor of FIG. 4.
FIGS. 10A and 10B illustrate a cross-sectional view and a top view of some embodiments of the semiconductor capacitor of FIG. 5.

FIGS. 8A and 8B illustrate a cross-sectional view 800*a* and a top view 800*b* of some embodiments of the semiconductor capacitor 112 of FIG. 3.

With reference to the cross-sectional view 800*a* of FIG. 8A, a height 806 of the protrusions 114*p* of the first capacitor electrode 114 is within a range of about 0.35 to 2 micrometers (um) or some other suitable value. In some embodiments, the height 806 of the protrusions 114*p* is greater than a height of the body structure 114*b*, thereby increasing the capacitance of the semiconductor capacitor 112. In various embodiments, an angle 802 between a bottom surface of the protrusions 114*p* and a corresponding sidewall of the protrusions 114*p* is within a range of about 90 to 135 degrees or some other suitable value. In various embodiments, a thickness t1 of the capacitor dielectric layer 118 is within a range of about 19 to 75 angstroms or some other suitable value. In various embodiments, the protrusions 114*p* have a polygon shape when viewed in cross-section.

With reference to the top view 800*b* of FIG. 8B, the plurality of protrusions 114*p* are represented in phantom and underlie the body structure 114*b*. The protrusions 114*p* are elongated in a first direction (e.g., along the y-axis) and are spaced from one another in a second direction (e.g., along the x-axis) by a distance 812. In some embodiments, the distance 812 is within a range of about 0.1 to 1 um or some other suitable value. A width 808 of the body structure 114*b* is, for example, within a range of about 0.5 to 2.4 um or some other suitable value. A length 810 of the body structure 114*b* is, for example, within a range of about 0.5 to 2.4 um or some other suitable value. A width 814 of each protrusions 114*p* is, for example, within a range of about 0.05 to 0.2 um or some other suitable value. A length 816 of each protrusions 114*p* is, for example, within a range of about 0.2 to 2 um or some other suitable value. In various embodiments, the semiconductor capacitor 112 may comprise a single protrusion (not shown). In yet further embodiments, the semiconductor capacitor 112 may comprise 2 to 100 protrusions 114*p* spaced across the width 808 of the body structure 114*b*.

FIGS. 9A and 9B illustrate a cross-sectional view 900*a* and a top view 900*b* of some embodiments of the semiconductor capacitor 112 of FIG. 4.

With reference to the cross-sectional view 900*a* of FIG. 9A, a height 906 of the protrusions 114*p* of the first capacitor electrode 114 is within a range of about 0.06 to 0.5 um or some other suitable value. In some embodiments, an angle 902 between opposing sidewalls of the protrusions 114*p* is within a range of about 35 to 90 degrees or some other suitable value. In various embodiments, the protrusions 114*p* have a rectangle shape when viewed in cross section.

With reference to the top view 900*b* of FIG. 9B, the plurality of protrusions 114*p* are arranged in an array comprising a plurality of rows and a plurality of columns. The protrusions 114*p* are spaced from one another by a distance 912 that is, for example, within a range of about 0.06 to 0.2 um or some other suitable value. A width 908 of the body structure 114*b* is, for example, within a range of about 0.7 to 2.4 um or some other suitable value. A length 910 of the body structure 114*b* is, for example, within a range of about 0.7 to 2.4 um or some other suitable value. A width 914 of each protrusion 114*p* is, for example, within a range of about 0.09 to 0.7 um or some other suitable value. A length 916 of each protrusion 114*p* is, for example, within a range of about 0.09 to 0.7, or some other suitable value. In various embodiments, the semiconductor capacitor may comprise 1 to 100 protrusions 114*p*.

FIGS. 10A and 10B illustrate a cross-sectional view 1000*a* and a top view 1000*b* of some embodiments of the semiconductor capacitor 112 of FIG. 5.

With reference to the cross-sectional view 1000*a* of FIG. 10A, a height 1002 of the protrusions 114*p* of the first capacitor electrode 114 is within a range of about 0.35 to 2 um or some other suitable value.

With reference to the top view 1000*b* of FIG. 10B, the plurality of protrusions 114*p* are arranged in an array comprising a plurality of rows and a plurality of columns. The protrusions 114*p* are spaced from one another by a distance 1006 that is, for example, within a range of about 0.1 to 0.5 um or some other suitable value. A width 1008 of the body structure 114*b* is, for example, within a range of about 0.5 to 2.4 um or some other suitable value. A length 1010 of the body structure 114*b* is, for example, within a range of about 0.5 to 2.4 um or some other suitable value. In some embodiments, the protrusions 114*p* have a circular shape when viewed in top view. A diameter 1004 of the protrusions 114*p* is, for example, within a range of about 0.09 to 0.2 um or some other suitable value.

FIGS. 11-37 illustrate various cross-sectional views 1100-3700 of some embodiments of a method of forming an image sensor comprising a pixel having a semiconductor capacitor disposed on a substrate. Although the cross-sectional views 1100-3700 shown in FIGS. 11-37 are described with reference to the method, it will be appreciated that the structures shown in FIGS. 11-37 are not limited to the method but rather may stand alone separate of the method. Furthermore, although FIGS. 11-37 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 11:
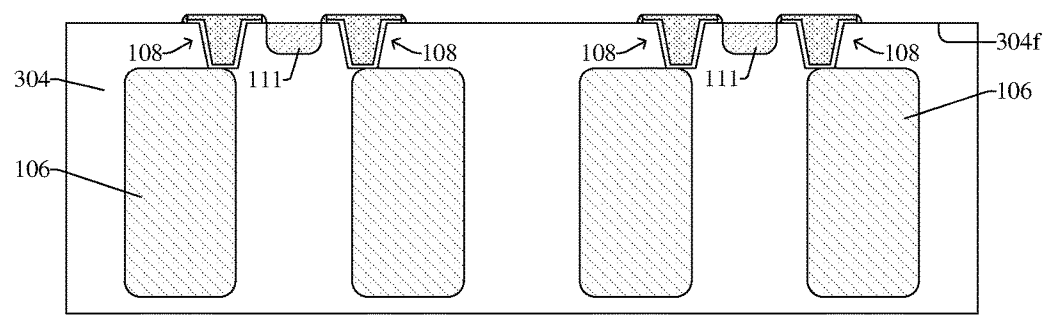
FIGS. 11-37 illustrate various cross-sectional views of some embodiments of a method of forming an image sensor comprising a pixel having a semiconductor capacitor disposed on a substrate.

As shown in cross-sectional view 1100 of FIG. 11, a plurality of photodetectors 106, a plurality of transfer transistors 108, and floating diffusion nodes 111 are formed within a first substrate 304. The first substrate 304 comprises a first doping type (e.g., p-type). The photodetectors 106 are or comprise a doped region of the first substrate 304 comprising a second doping type (e.g., n-type) opposite the first doping type. The photodetectors 106 may, for example, be formed by an ion implantation process or some other suitable process. The plurality of transfer transistors 108 are formed on a front-side surface **304*f* of the first substrate 304. The transfer transistors 108 respectively comprise a gate electrode extending into the first substrate 304, a gate dielectric disposed between the first substrate 304 and the gate electrode, and a sidewall spacer disposed along sidewalls of the gate electrode and gate dielectric. The floating diffusion nodes 111 are formed in the first substrate 304 by, for example, an ion implantation process or another suitable process. The floating diffusion nodes 111 comprise the second doping type (e.g., n-type). The first substrate 304** may, for example, be or comprise silicon, monocrystalline silicon, epitaxial silicon, germanium, silicon germanium, or another suitable semiconductor material.

Figure 12:
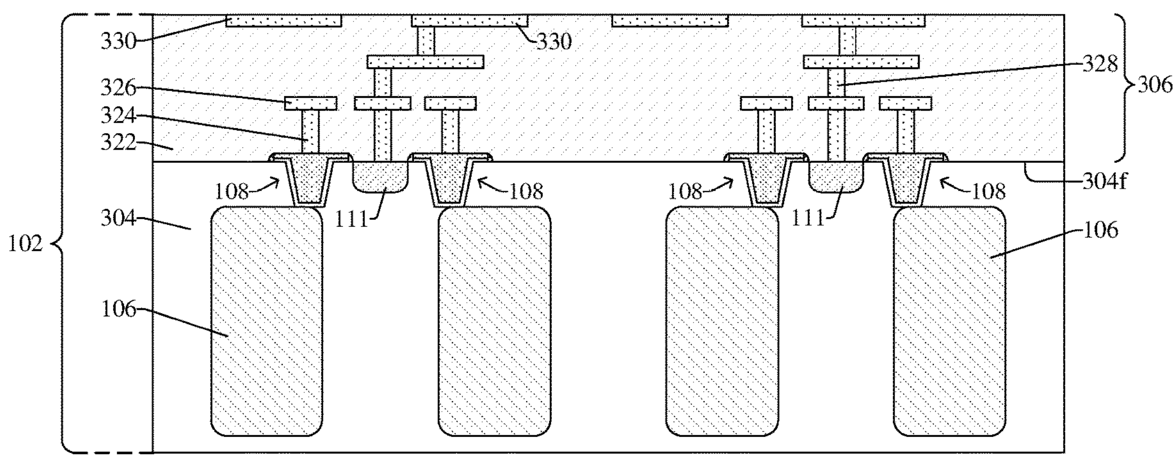

As shown in cross-sectional view 1200 of FIG. 12, a first interconnect structure 306 is formed on the front-side surface **304*f* of the first substrate 304, thereby defining a first IC die 102. The first interconnect structure 306 comprises a plurality of conductive contacts 324, a plurality of conductive wires 326, a plurality of conductive vias 328, and a plurality of bond pads 330 disposed within a dielectric structure 322. Layers in the first interconnect structure 306** may, for example, be formed by a single damascene process, a dual damascene process, some other suitable fabrication process, or the like.

Figure 13:
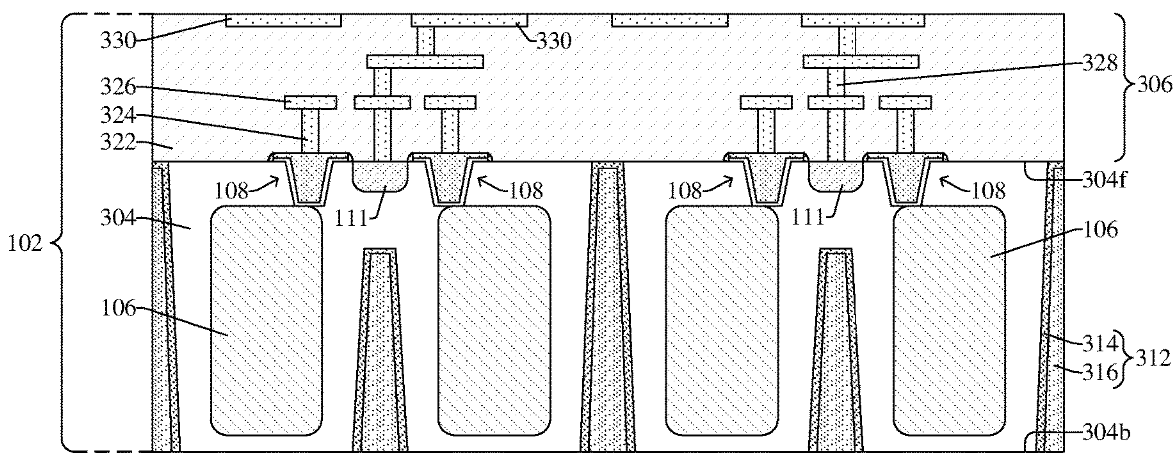

As shown in cross-sectional view 1300 of FIG. 13, a trench isolation structure 312 is formed in the first substrate 304 between adjacent photodetectors in the plurality of photodetectors 106. The trench isolation structure 312 comprises a trench fill layer 316 extending into a back-side surface **304*b* of the first substrate 304 and a liner layer 314 disposed between the trench fill layer 316 and the first substrate 304. In some embodiments, a process for forming the isolation structure comprises: patterning the back-side surface 304*b* of the first substrate 304 to form a trench extending into the first substrate 304; depositing (e.g., by physical vapor deposition (PVD), chemical vapor deposition (CVD), atomic layer deposition (ALD), etc.) the liner layer 314 lining the trench; depositing (e.g., by PVD, CVD, ALD, sputtering, electroplating, etc.) the trench fill layer 316 within the trench; and performing a planarization process (e.g., a chemical mechanical planarization (CMP) process) on the liner layer 314 and the trench fill layer 316**.

Figure 14:
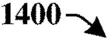
Figure 14:
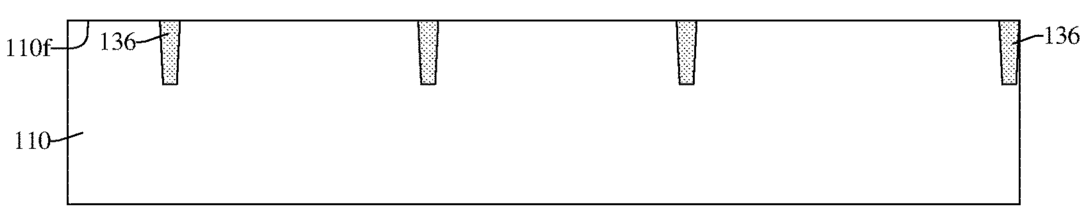

As shown in cross-sectional view 1400 of FIG. 14, a second substrate 110 is provided and an isolation structure 136 is formed in the second substrate 110. In some embodiments, a process for forming the isolation structure 136 includes: patterning a front-side surface **110*f* of the second substrate 110 to form one or more trenches extending into the second substrate 110; depositing (e.g., by PVD, CVD, ALD, etc.) an isolation material (e.g., silicon dioxide, silicon nitride, etc.) in the one or more trenches; and performing a planarization process (e.g., a CMP process) on the isolation material. The second substrate 110 comprises the first doping type (e.g., p-type). The second substrate 110** may, for example, be or comprise silicon, monocrystalline silicon, epitaxial silicon, germanium, silicon germanium, or another suitable semiconductor material.

Figure 15:
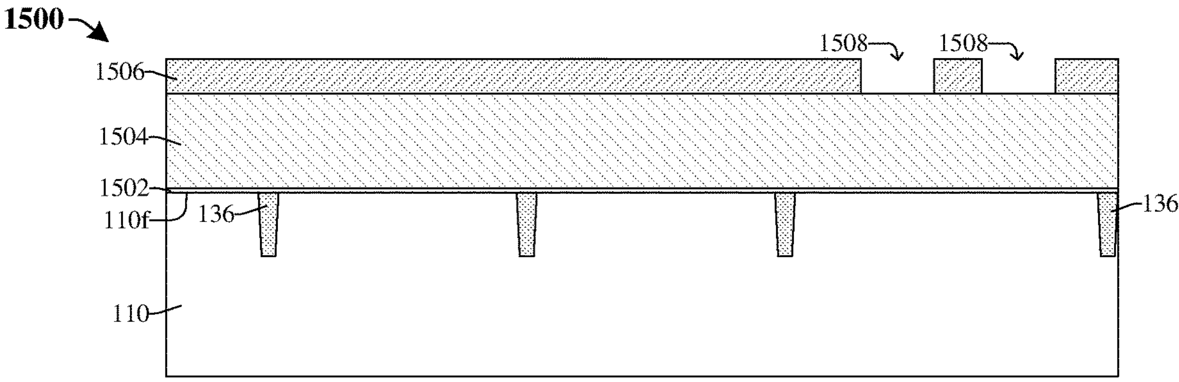

As shown in cross-sectional view 1500 of FIG. 15, a dielectric layer 1502, a hard mask layer 1504, and a masking layer 1506 are formed on the front-side surface **110*f* of the second substrate 110. In some embodiments, the dielectric layer 1502 (e.g., comprising silicon dioxide) and the hard mask layer 1504 (e.g., comprising silicon dioxide, a metal nitride such as silicon nitride, a metal, etc.) are respectively deposited by PVD, CVD, ALD, or another suitable growth or deposition process. The masking layer 1506 is formed over the hard mask layer 1504 and comprises sidewalls defining openings 1508 over the second substrate 110. The masking layer 1506** may, for example, be or comprise a photoresist or some other suitable material.

Figure 16:
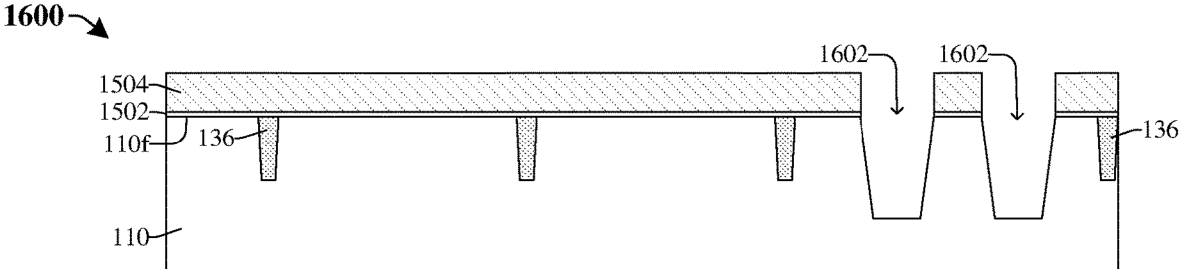

As shown in cross-sectional view 1600 of FIG. 16, a patterning process is performed on the second substrate 110 according to the masking layer (1506 of FIG. 15) to form a plurality of trenches 1602 extending into the front-side surface **110*f* of the second substrate 110. In some embodiments, the patterning process includes performing a dry etch process (e.g., a plasma etch, an ion beam etch, a reactive ion etch, etc.) or some other suitable process. The trenches 1602 are each defined by opposing sidewalls and an upper surface of the second substrate 110**.

Figure 17:
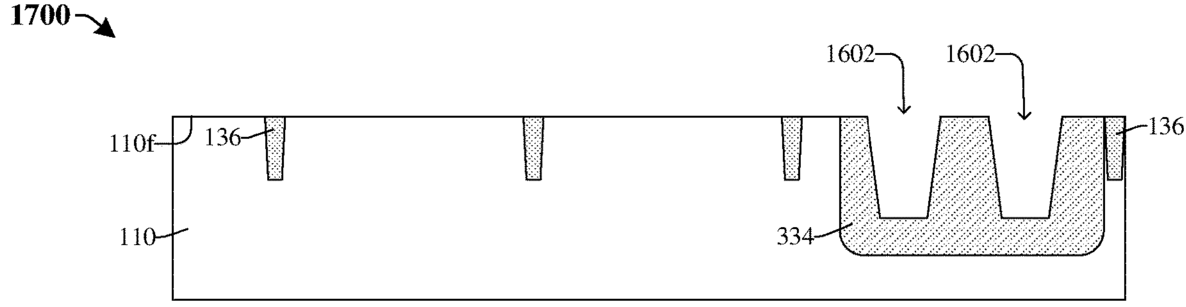

As shown in cross-sectional view 1700 of FIG. 17, a removal process is performed to remove the dielectric layer (1502 of FIG. 16) and the hard mask layer (1504 of FIG. 16) and a well region 334 is formed within the second substrate 110. The well region 334 comprises the first doping type (e.g., p-type) and may be formed by an ion implantation process or some other suitable process. In some embodiments, the removal process includes performing a wet etch process or some other suitable process. In various embodiments, after forming the well region 334 an annealing process is performed on the second substrate 110.

Figure 18:
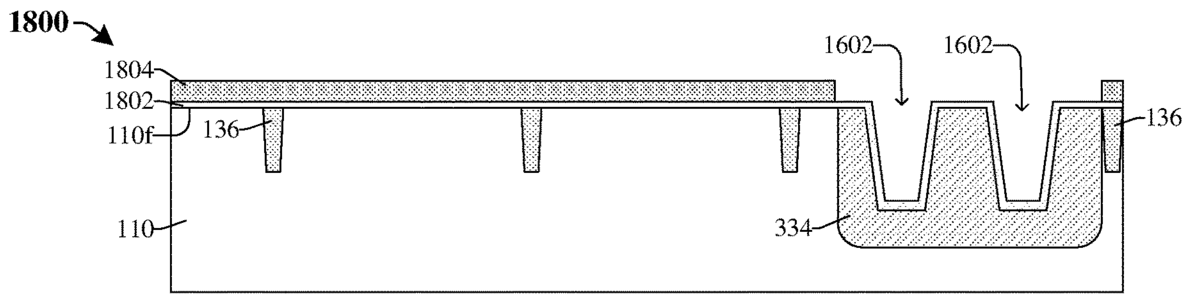

As shown in cross-sectional view 1800 of FIG. 18, a dielectric liner layer 1802 and a masking layer 1804 are formed over the second substrate 110. The dielectric liner layer 1802 (e.g., comprising silicon dioxide) may, for example, be deposited by CVD, PVD, ALD, or another suitable growth or deposition process. The dielectric liner layer 1802 lines the trenches 1602 and extends along the front-side surface **110*f* of the second substrate 110. The masking layer 1804 comprising opposing sidewalls defining an opening over the trenches 1602. The masking layer 1804** may, for example, be or comprise a photoresist or some other suitable material.

Figure 19:
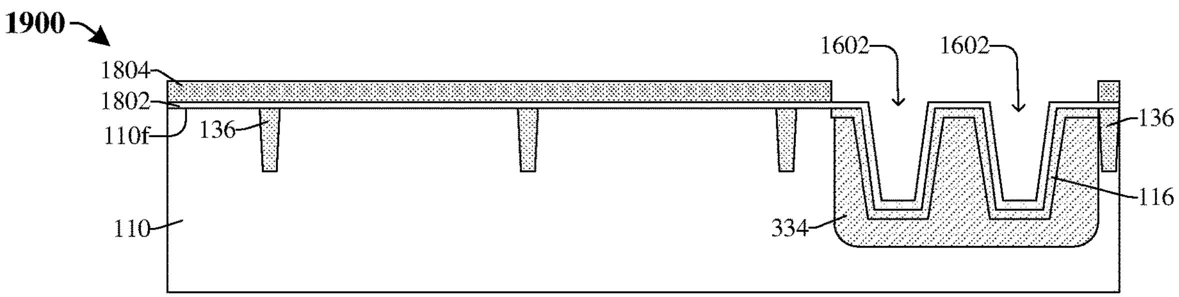

As shown in cross-sectional view 1900 of FIG. 19, a doped capacitor region 116 is formed in the second substrate 110. The doped capacitor region 116 lines the trenches 1602 and extends along a portion of the front-side surface **110*f* of the second substrate 110. For example, the doped capacitor region 116 extends along the opposing sidewalls and lower surfaces of the second substrate 110 that define the trenches 1602. The doped capacitor region 116 comprises the second doping type (e.g., n-type). In some embodiments, the doped capacitor region 116 has a higher doping concentration than that of the well region 334. In various embodiments, the doped capacitor region 116 is formed by a doping process (e.g., a beamline doping process, a plasma doping process, etc.) or some other suitable process. In various embodiments, the doping process is performed according to the masking layer 1804 and through the dielectric liner layer 1802, where the dielectric liner layer 1802 is configured to mitigate damage to the second substrate 110** during the doping process.

Figure 20:
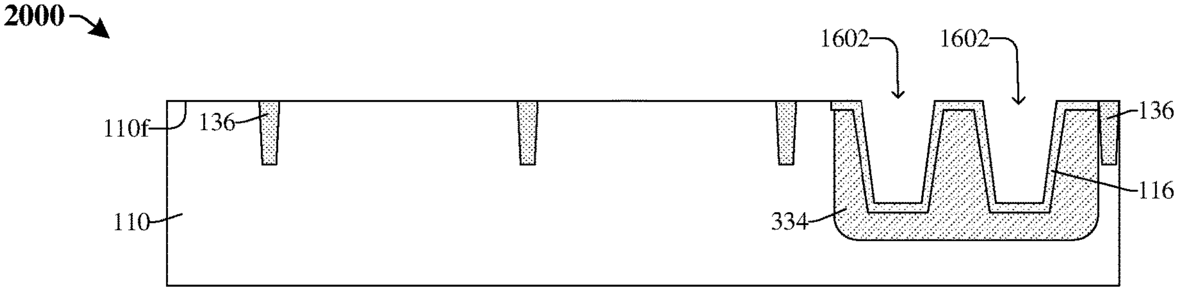

As shown in cross-sectional view 2000 of FIG. 20, a removal process is performed to remove the dielectric liner layer (1802 of FIG. 19) and/or the masking layer (1804). In some embodiments, the removal process includes a wet etch process, a dry etch process, or some other suitable process.

Figure 21:
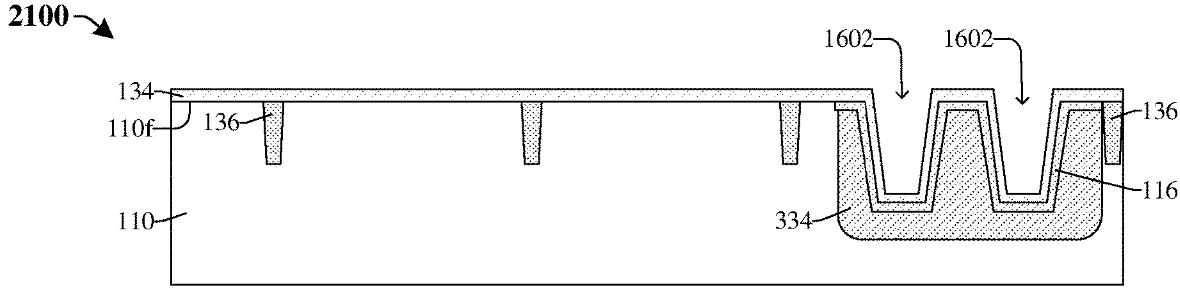

As shown in cross-sectional view 2100 of FIG. 21, a gate dielectric layer 134 is deposited over the second substrate 110. The gate dielectric layer 134 extends along the front-side surface **110*f* of the second substrate 110 and lines the trenches 1602. The gate dielectric layer 134 may, for example, be deposited on the second substrate 110 by CVD, PVD, ALD, or another suitable growth or deposition process. In some embodiments, the gate dielectric layer 134** is or comprises silicon dioxide, aluminum oxide, titanium oxide, tantalum oxide, hafnium oxide, some other suitable dielectric material, or any combination of the foregoing.

Figure 22:
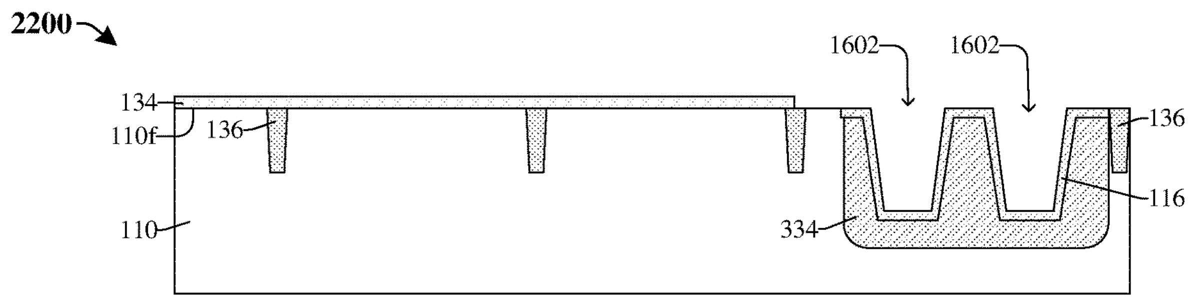

As shown in cross-sectional view 2200 of FIG. 22, a patterning process is performed on the gate dielectric layer 134. The patterning process removes the gate dielectric layer 134 from over the doped capacitor region 116. In some embodiments, the patterning process includes: forming a masking layer (not shown) over the second substrate 110; etching the gate dielectric layer 134 according to the masking layer; and performing a removal process to remove the masking layer.

Figure 23:
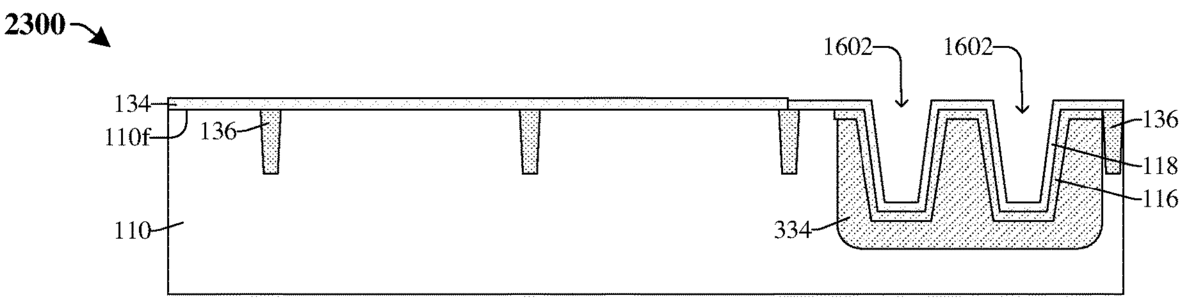

As shown in cross-sectional view 2300 of FIG. 23, a capacitor dielectric layer 118 is formed over the doped capacitor region 116 lining the trenches 1602. The capacitor dielectric layer 118 extends along the doped capacitor region 116. In some embodiments, a process for forming the capacitor dielectric layer 118 includes depositing (e.g., by PVD, CVD, ALD, etc.) the capacitor dielectric layer 118 over the second substrate 110 and patterning the capacitor dielectric layer 118 to remove the capacitor dielectric layer 118 from over the gate dielectric layer 134. The capacitor dielectric layer 118 may, for example, be or comprise silicon dioxide, hafnium oxide, zirconium oxide, aluminum oxide, or some other suitable material. Further, the capacitor dielectric layer 118 is formed to a thickness within a range of about 19 to 75 angstroms or some other suitable value. In various embodiments, a thickness of the gate dielectric layer 134 is greater than the thickness of the capacitor dielectric layer 118. In yet further embodiments, a dielectric material of the capacitor dielectric layer 118 is different from a dielectric material of the gate dielectric layer 134.

Figure 24:
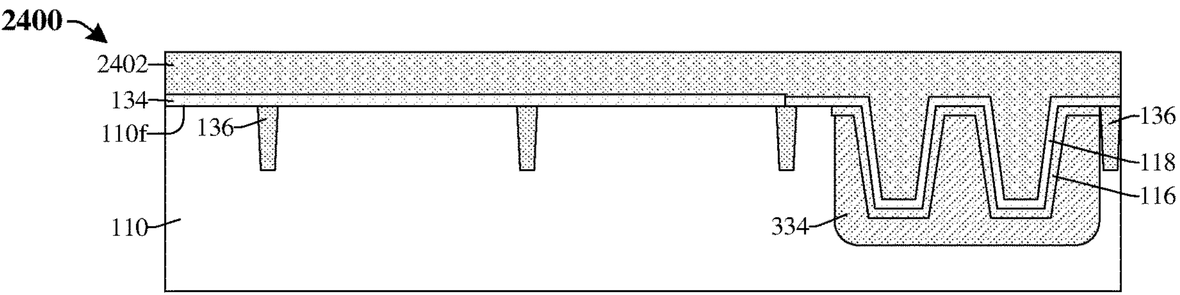

As shown in cross-sectional view 2400 of FIG. 24, a gate electrode material 2402 is deposited over the second substrate 110 and fills the trenches (1602 of FIG. 23). The gate electrode material 2402 overlies and extends along the gate dielectric layer 134 and the capacitor dielectric layer 118. In some embodiments, the gate electrode material 2402 is deposited by CVD, PVD, ALD, electroplating, or some other suitable growth or deposition process. The gate electrode material 2402 may, for example, be or comprise polysilicon, a metal (e.g., aluminum, tungsten, titanium, copper, etc.), or some other suitable material. In various embodiments, the gate electrode material 2402 comprises polysilicon. In such embodiments, an ion implantation process is performed after depositing the gate electrode material 2402 to dope the gate electrode material 2402 with one or more dopants, and after the ion implantation process an annealing process is performed on the gate electrode material 2402.

Figure 25:
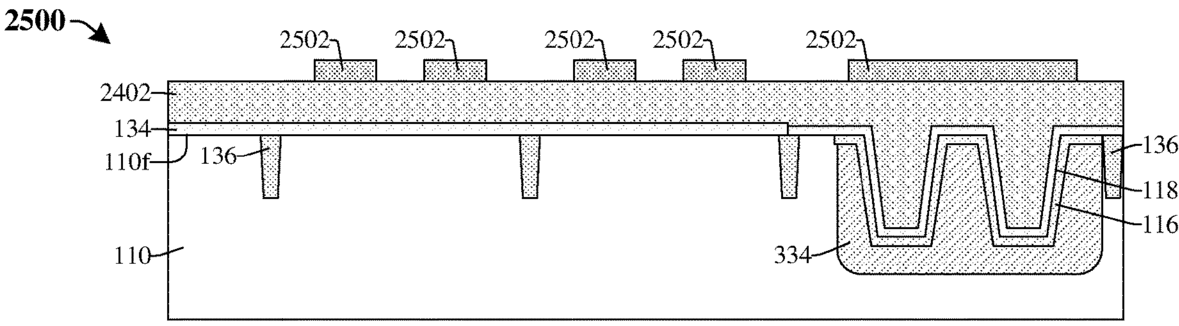

As shown in cross-sectional view 2500 of FIG. 25, a masking layer 2502 is formed over the gate electrode material 2402. The masking layer 2502 may, for example, be or comprise a photoresist or some other material.

Figure 26:
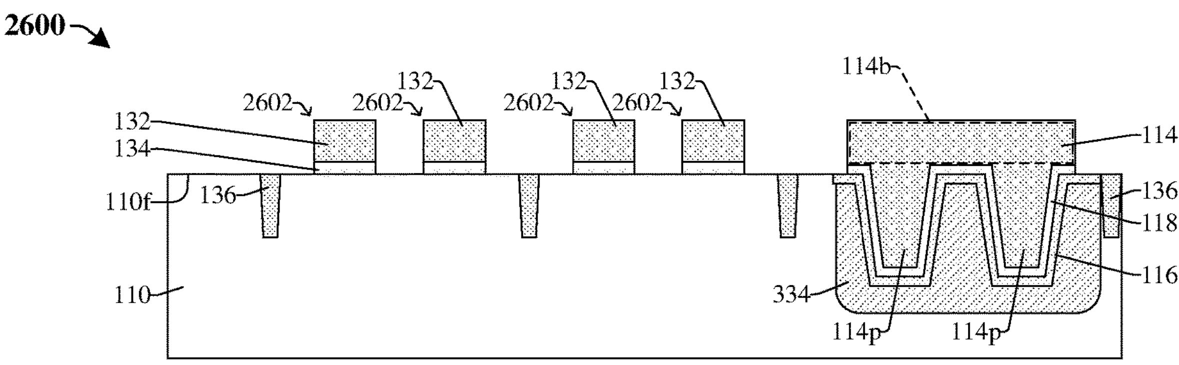

As shown in cross-sectional view 2600 of FIG. 26, a patterning process is performed on the gate electrode material (2402 of FIG. 25), the gate dielectric layer 134, and the capacitor dielectric layer 118 according to the masking layer (2502 of FIG. 25), thereby defining gate electrodes 132, a first capacitor electrode 114, and a plurality of gate structures 2602 over the second substrate 110. In some embodiments, the patterning process includes performing a dry etch process (e.g., a plasma etch, an ion beam etch, a reactive ion etch, etc.) or some other suitable process. The gate structures 2602 respectively comprise a gate electrode 132 over the gate dielectric layer 134. In various embodiments, the gate electrodes 132 and the first capacitor electrode 114 are formed concurrently. The first capacitor electrode 114 comprises a body structure **114*b* overlying the front-side surface 110*f* of the second substrate 110 and a plurality of protrusions 114*p* extending from the body structure 114*b* into the second substrate 110. The doped capacitor region 116 extends long sidewalls and a lower surface of each of the protrusions 114*p***.

Figure 27:
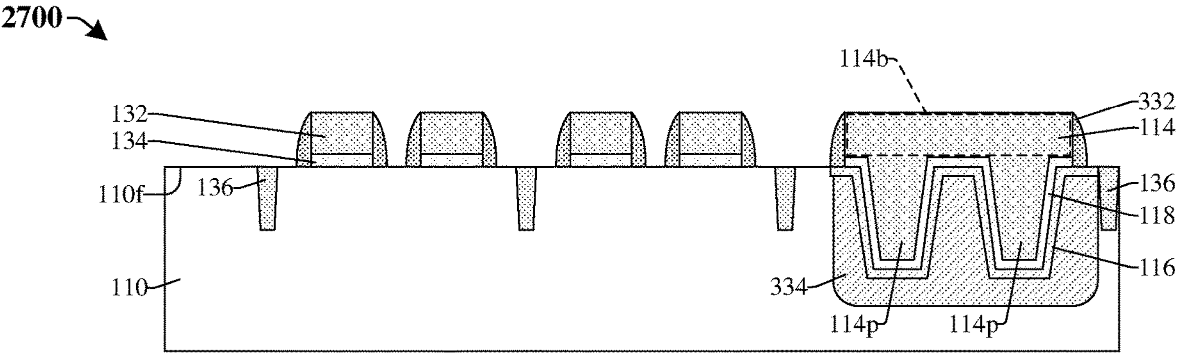

As shown in cross-sectional view 2700 of FIG. 27, a sidewall spacer structure 332 is formed along sidewalls of the first capacitor electrode 114 and sidewalls of the gate electrodes 132. The sidewall spacer structure 332 may, for example, be or comprise silicon nitride, silicon carbide, silicon oxynitride, or some other suitable dielectric material.

Figure 28:
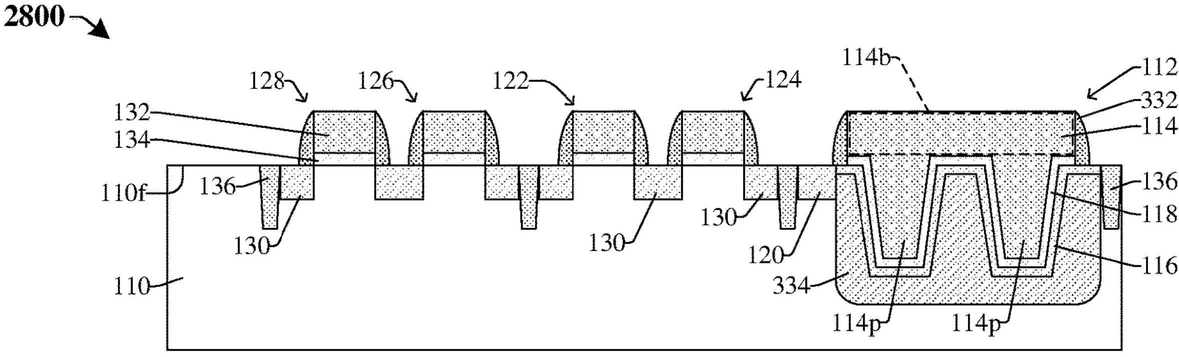

As shown in cross-sectional view 2800 of FIG. 28, a doping process is performed on the second substrate 110 to form a plurality of source/drain regions 130 and a capacitor contact region 120 in the second substrate 110. This, in part, defines a plurality of pixel transistors 122-128 and a semiconductor capacitor 112 on the front-side surface **110*f* of the second substrate 110. In some embodiments, the plurality of pixel transistors 122-128 and the semiconductor capacitor 112 are formed concurrently. In various embodiments, the doping process includes performing an ion implantation process on the second substrate 110. The plurality of source/drain regions 130 and the capacitor contact region 120 comprise the second doping type (e.g., n-type) and have a higher doping concentration than the well region 334. In various embodiments, a process for forming the semiconductor capacitor 112 includes the processing steps illustrated and/or described in FIGS. 15-28**.

Figure 29:
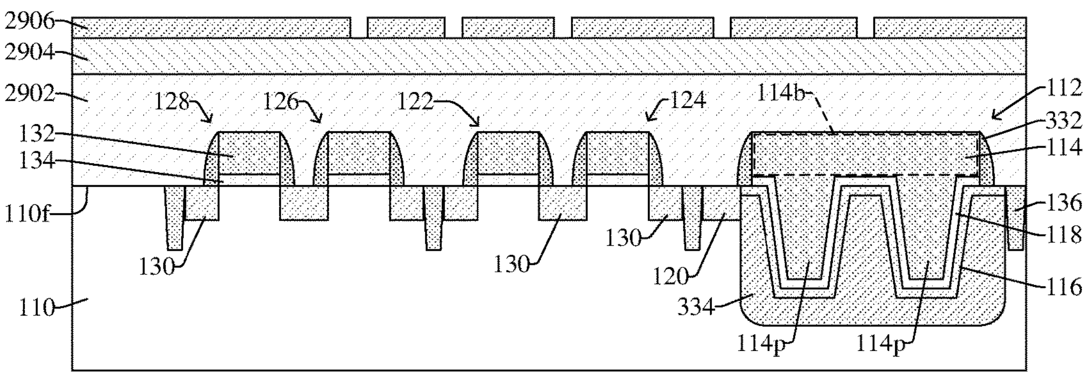

As shown in cross-sectional view 2900 of FIG. 29, an inter-level dielectric (ILD) layer 2902, a hard mask layer 2904, and a masking layer 2906 are formed over the second substrate 110. The ILD layer 2902 may, for example, be or comprise silicon dioxide or the like. The masking layer 2906 may, for example, be a photoresist or some other suitable material. In further embodiments, the ILD layer 2902 and the hard mask layer 2904 may be deposited over the second substrate 110 by CVD, PVD, ALD, or some other suitable growth or deposition process.

Figure 30:
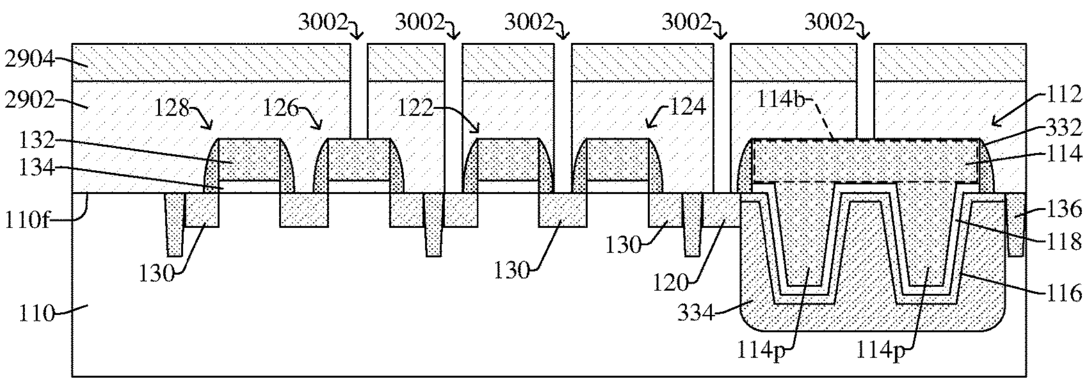

As shown in cross-sectional view 3000 of FIG. 30, a patterning process is performed on the ILD layer 2902 and the hard mask layer 2904 according to the masking layer (2906 of FIG. 29) to form a plurality of openings 3002 in the ILD layer 2902 over the second substrate 110. In some embodiments, the patterning process includes performing a dry etch process (e.g., a plasma etch, an ion beam etch, a reactive ion etch, etc.) or some other suitable process.

Figure 31:
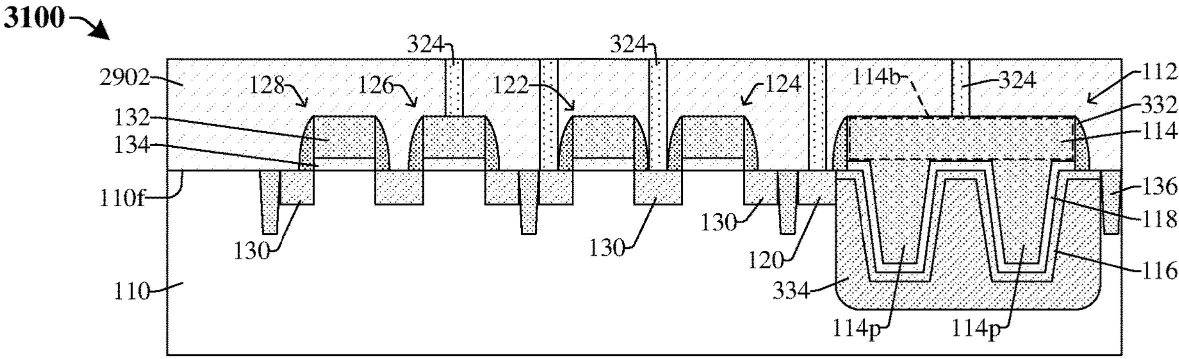

As shown in cross-sectional view 3100 of FIG. 31, a plurality of conductive contacts 324 are formed within the ILD layer 2902 over the second substrate 110. In some embodiments, a process for forming the plurality of conductive contacts 324 includes: depositing (e.g., by CVD, PVD, electroplating, etc.) a conductive material (e.g., aluminum, titanium, tungsten, etc.) over the second substrate 110 and within the plurality of openings (3002 of FIG. 30) and performing a planarization process (e.g., CMP process) into the conductive material.

Figure 32:
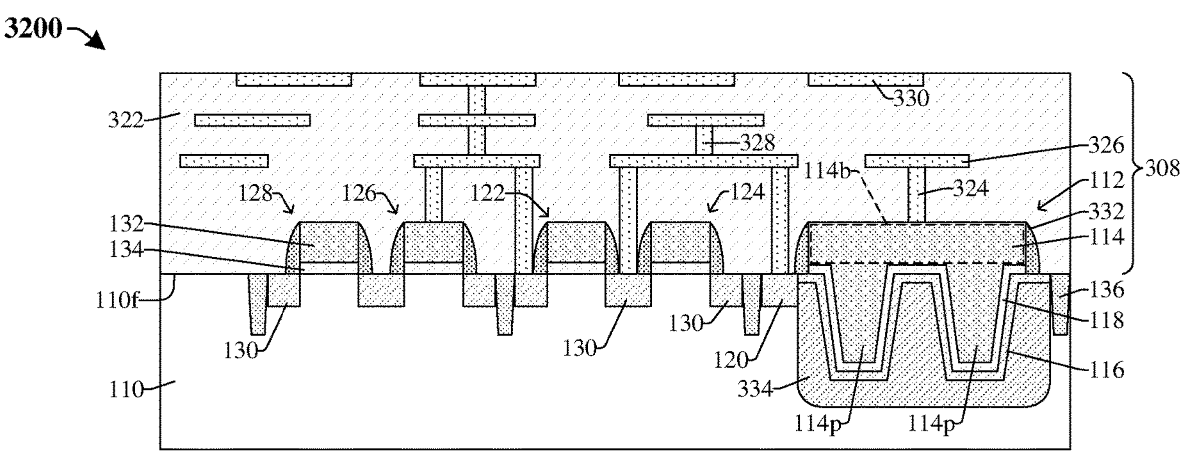

As shown in cross-sectional view 3200 of FIG. 32, a second interconnect structure 308 is formed on the front-side surface **110*f* of the second substrate 110. The second interconnect structure 308 comprises the plurality of conductive contacts 324, a plurality of conductive wires 326, a plurality of conductive vias 328, and a plurality of bond pads 330 disposed within a dielectric structure 322. The ILD layer (2902 of FIG. 31) is part of the dielectric structure 322. In various embodiments, layers in the second interconnect structure 308** may, for example, be formed by a single damascene process, a dual damascene process, some other suitable fabrication process, or the like.

Figure 33:
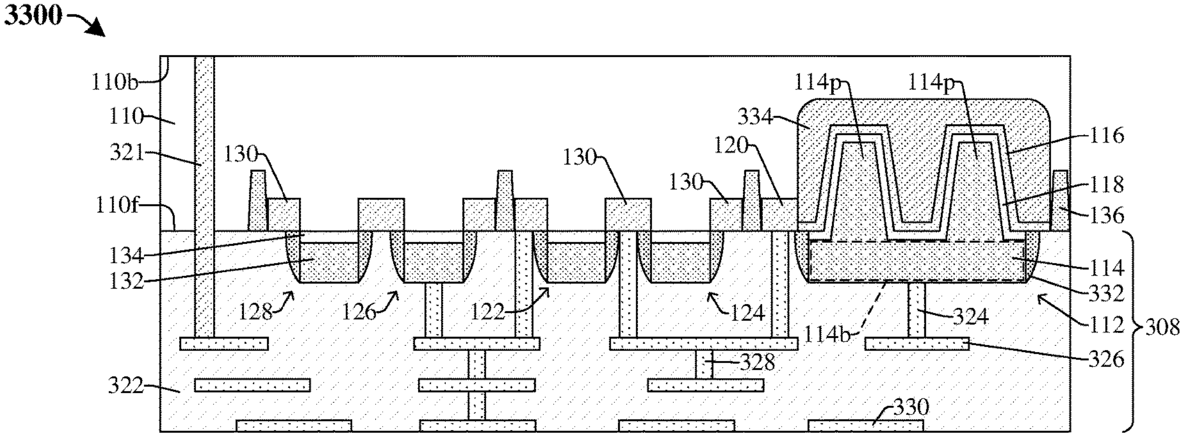

As shown in cross-sectional view 3300 of FIG. 33, a through substrate via (TSV) 321 is formed extending through the second substrate 110 to the second interconnect structure 308. The TSV 321 is electrically coupled to conductive structures (e.g., a conductive wire) in the second interconnect structure 308. In some embodiments, a process for forming the TSV 321 includes: patterning a back-side surface **110*b* of the second substrate 110 to form a TSV opening extending from the second substrate 110 to the second interconnect structure 308**; depositing (e.g., by CVD, PVD, ALD, electroplating, etc.) a conductive material within the TSV opening; and performing a planarization process (e.g., a CMP process) on the conductive material.

Figure 34:
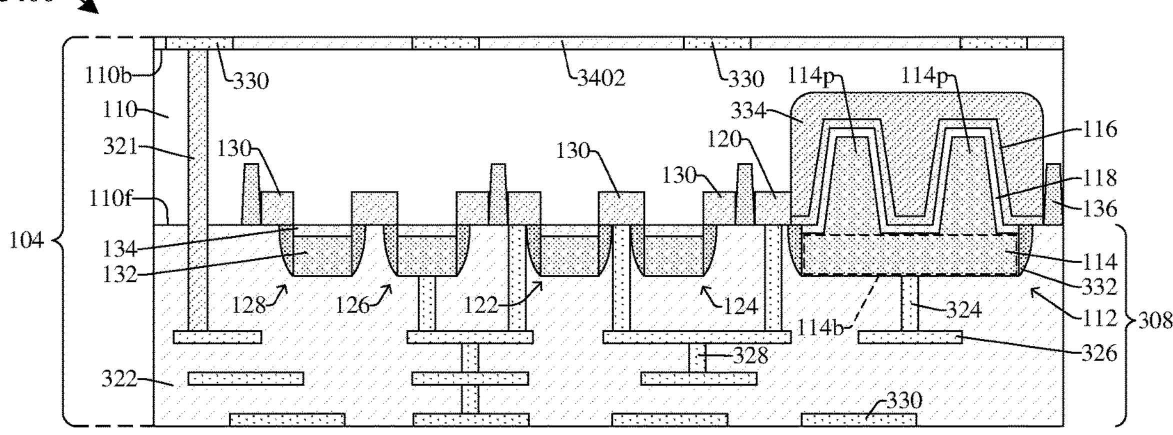

As shown in cross-sectional view 3400 of FIG. 34, a plurality of bond pads 330 and a bond dielectric layer 3402 are formed on the back-side surface **110*b* of the second substrate 110, thereby defining a second IC die 104**.

Figure 35:
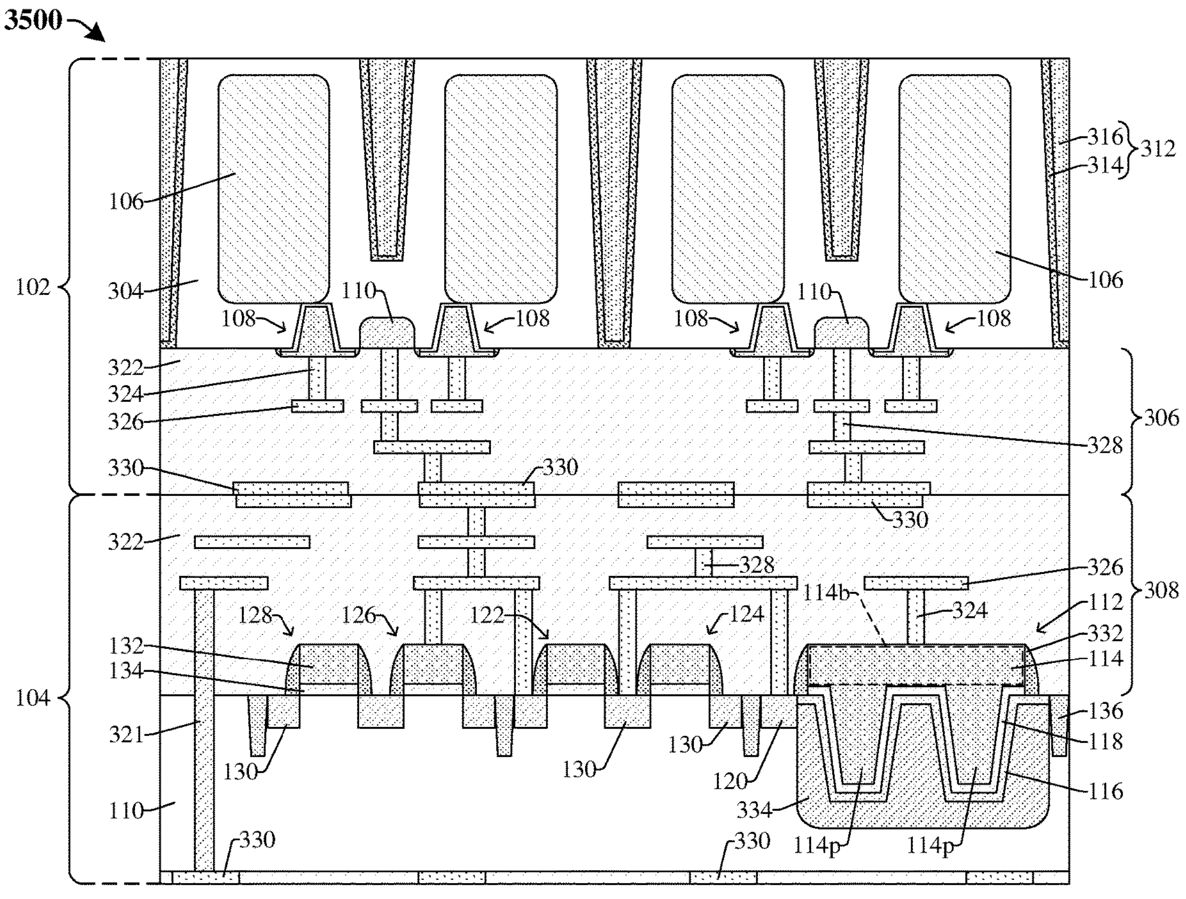

As shown in cross-sectional view 3500 of FIG. 35, a first bonding process is performed to bond the first IC die 102 to the second IC die 104. After the first bonding process, the first interconnect structure 306 of the first IC die 102 meets the second interconnect structure 308 of the second IC die 104 at a first bonding interface. In some embodiments, the first bonding process includes a eutectic bonding process, a fusion bonding process, a dielectric-to-dielectric bonding process, a metal-to-metal bonding process, some other suitable bonding process, or any combination of the foregoing. In various embodiments, the first bonding interface between the first and second IC dies 102, 104 includes dielectric-to-dielectric bonds and metal-to-metal bonds.

Figure 36:
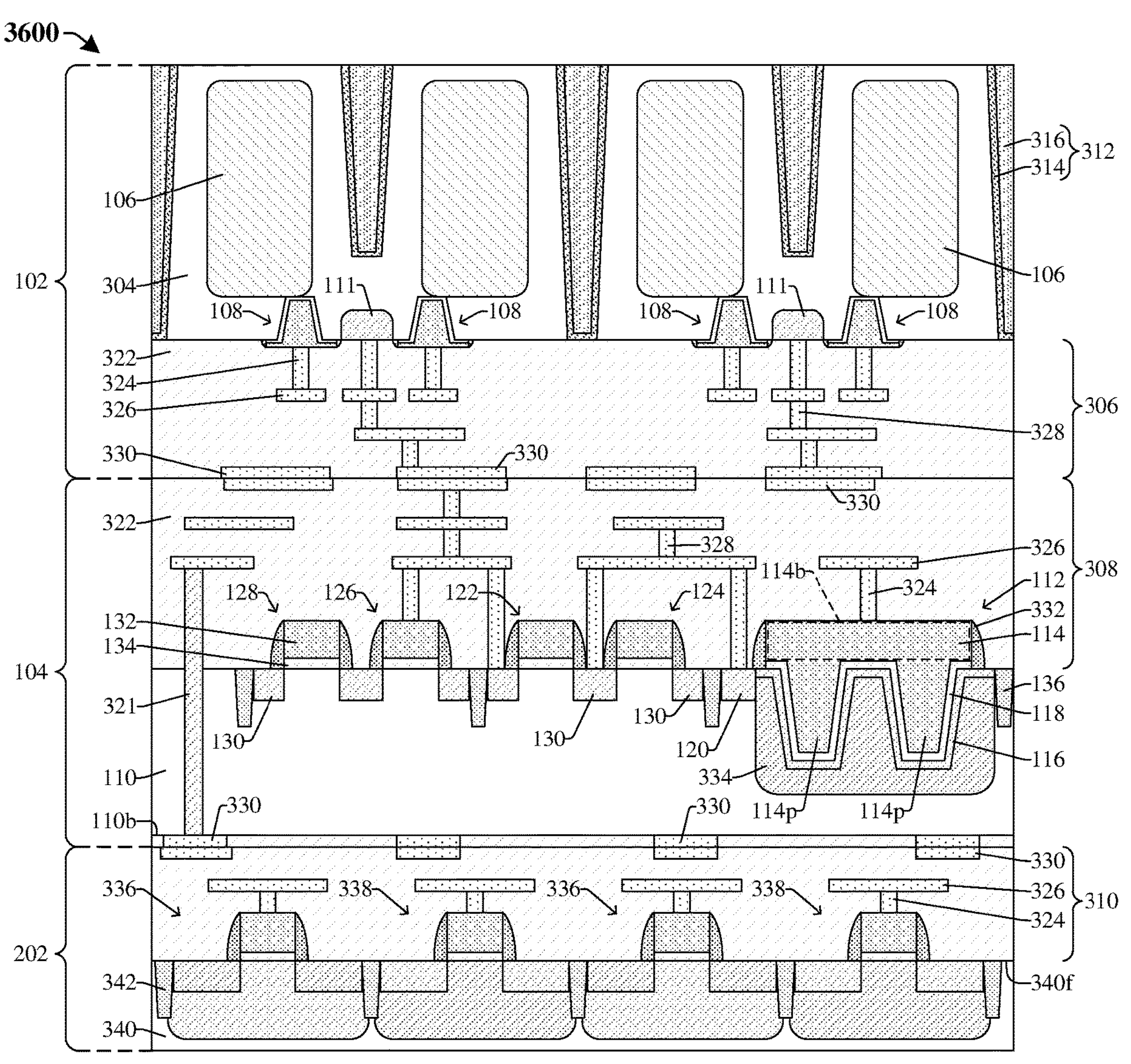

As shown in cross-sectional view 3600 of FIG. 36, a third IC die 202 is formed and a second bonding process is performed to bond the third IC die 202 to the second IC die 104. In various embodiments, forming the third IC die 202 includes forming a plurality of semiconductor devices 336, 338 on a front-side surface **340*f* of a third substrate 340 and forming a third interconnect structure 310 on the front-side surface 340*f* of the third substrate 340. After the second bonding process, the third interconnect structure 310 of the third IC die 202 meets the bond pads 330 and the bond dielectric layer 3402 disposed on the back-side surface 110*b* of the second substrate 110 at a second bonding interface. In some embodiments, the second bonding process includes a eutectic bonding process, a fusion bonding process, a dielectric-to-dielectric bonding process, a metal-to-metal bonding process, some other suitable bonding process, or any combination of the foregoing. In various embodiments, the second bonding interface between the second and third IC dies 104, 202 includes dielectric-to-dielectric bonds and metal-to-metal bonds. In various embodiments, layers in the third interconnect structure 310** may, for example, be formed by a single damascene process, a dual damascene process, some other suitable fabrication process, or the like.

Figure 37:
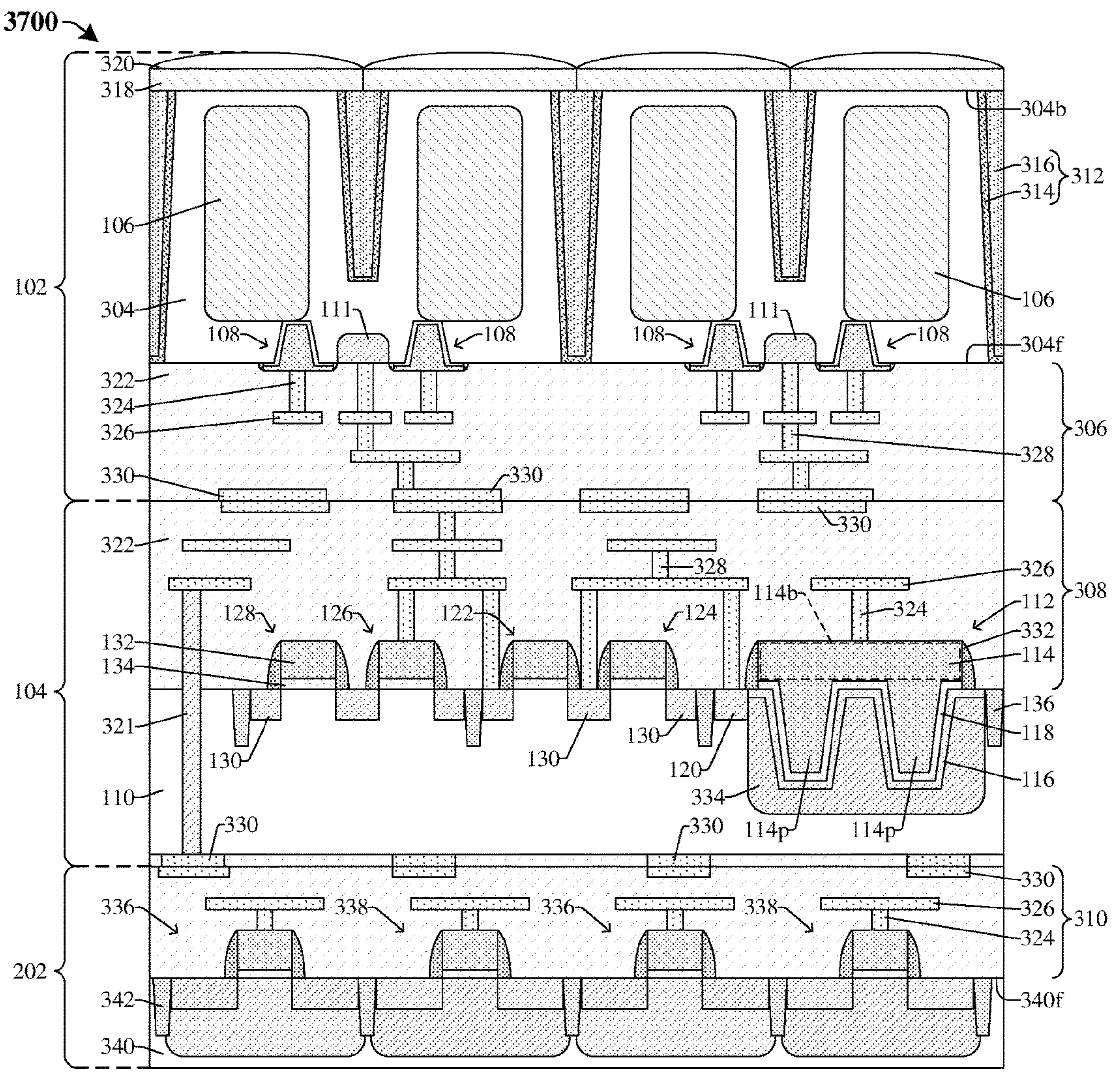

As shown in cross-sectional view 3700 of FIG. 37, a plurality of light filters 318 are formed on the back-side surface **304*b* of the first substrate 304 and a plurality of micro-lenses 320 are formed on the plurality of light filters 318. The light filters 318 may be formed by depositing and patterning respective color filter layers corresponding to the plurality of light filters 318. The micro-lenses 320 may be formed by depositing a micro-lens material over the light filters 318 and patterning the micro-lens material to form the plurality of micro-lenses 320. In various embodiments, the plurality of light filters 318 and the plurality of micro-lenses 320 may be formed on the back-side surface 304*b* of the first substrate 304 before performing the first bonding process of FIG. 35. For example, the plurality of light filters 318 and the plurality of micro-lenses 320 may be formed immediately after forming the trench isolation structure 312**.

Figure 41:
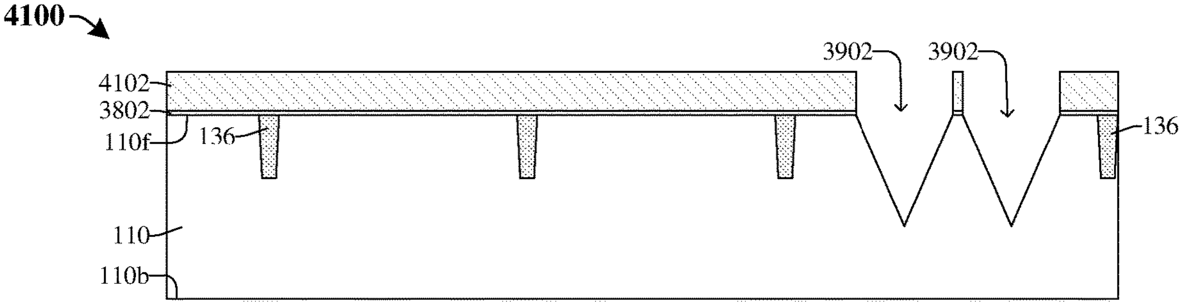
Figure 42:
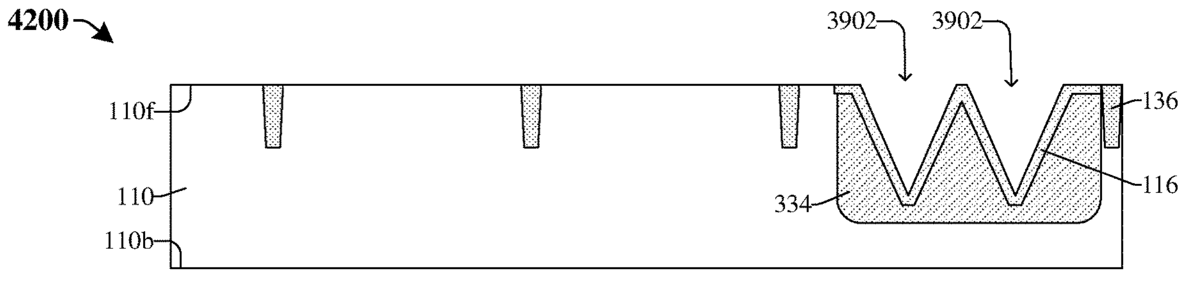
Figure 43:
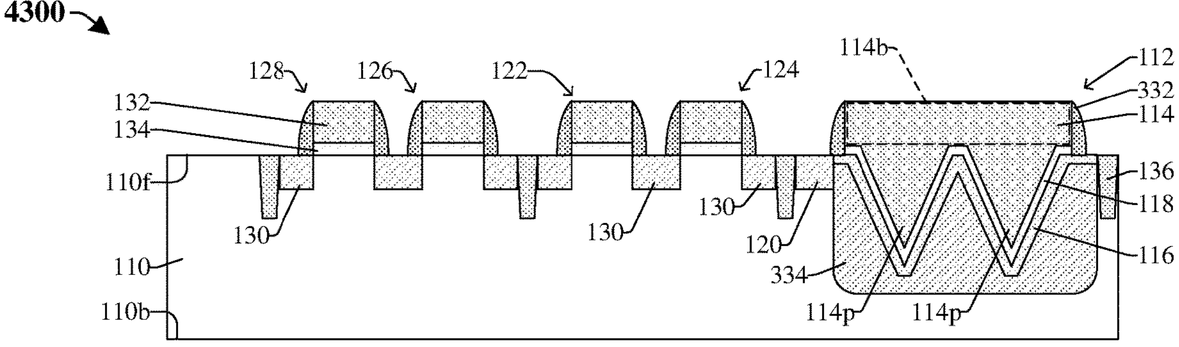

FIGS. 38-43 illustrate cross-sectional views 3800-4300 of some embodiments of acts that may be performed in place of the acts at FIGS. 15-28, such that the method of FIGS. 11-37 may alternatively proceed from FIGS. 11-14 to FIGS. 38-43, and then from FIG. 43 to FIGS. 29-37 (skipping FIGS. 15-28). In various embodiments, FIGS. 38-43 illustrate cross-sectional views 3800-4300 of some other embodiments of forming the semiconductor capacitor 112.

Although the cross-sectional views 3800-4300 shown in FIGS. 38-43 are described with reference to a method, it will be appreciated that the structures shown in FIGS. 38-43 are not limited to the method but rather may stand alone separate of the method. Furthermore, although FIGS. 38-43 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 38:
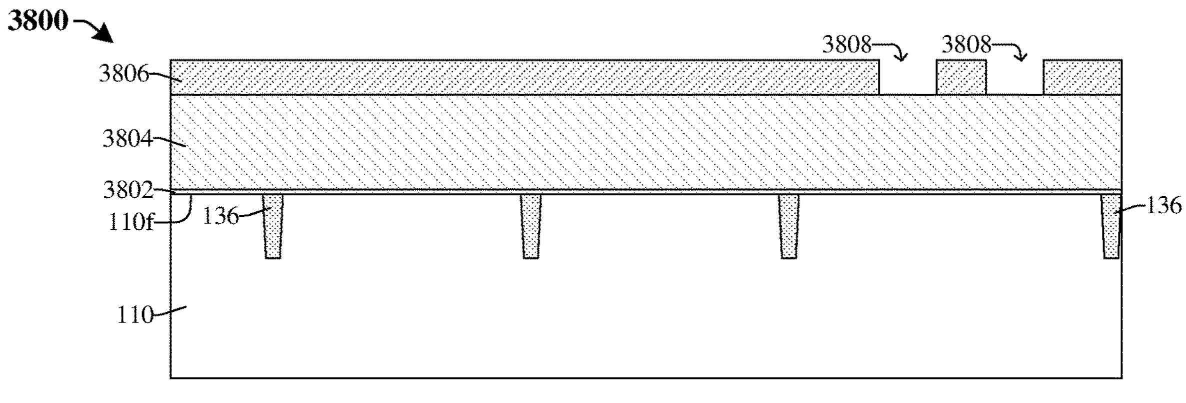
FIGS. 38-43 illustrate various cross-sectional views of some other embodiments of a method of forming an image sensor comprising a pixel having a semiconductor capacitor disposed on a substrate.

As shown in cross-sectional view 3800 of FIG. 38, a dielectric layer 3802, a first hard mask layer 3804, and a first masking layer 3806 are formed on the front-side surface **110*f* of the second substrate 110. The dielectric layer 3802 and the first hard mask layer 3804 may, for example, each be deposited on the second substrate 110 by PVD, CVD, ALD, or some other suitable growth or deposition process. The first masking layer 3806 is formed on the first hard mask layer 3804 and comprises sidewalls defining openings 3808**.

Figure 39:
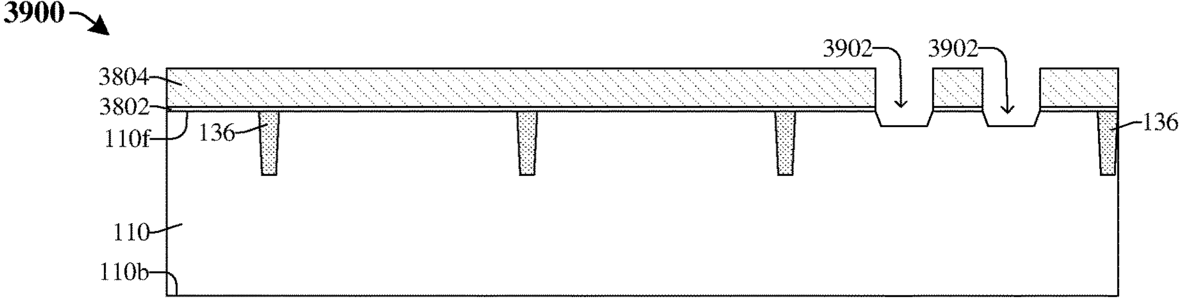

As shown in cross-sectional view 3900 of FIG. 39, a first patterning process is performed on the second substrate 110 according to the first masking layer (3806 of FIG. 38) to form a plurality of trenches 3902 extending into the front-side surface **110*f* of the second substrate 110. In some embodiments, the first patterning process includes performing a dry etch process (e.g., a plasma etch, an ion beam etch, a reactive ion etch, etc.) or some other suitable process. A removal process may be performed to remove the first hard mask layer 3804** (not shown).

Figure 40:
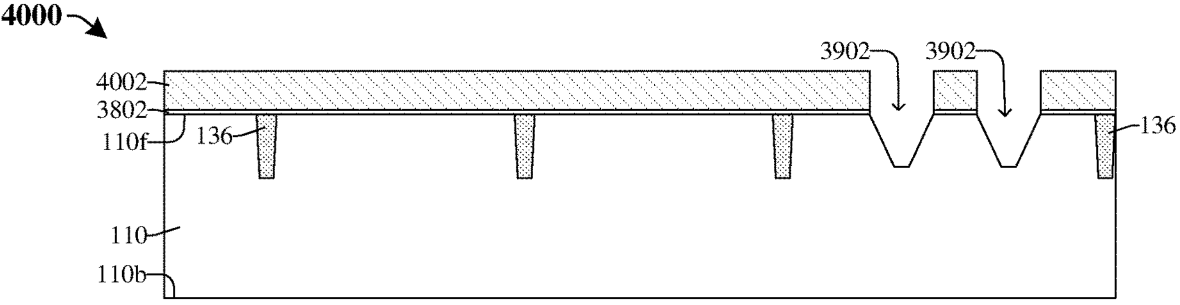

As shown in cross-sectional view 4000 of FIG. 40, a second hard mask layer 4002 is formed over the second substrate 110 and a second patterning process is performed on the second substrate 110 to expand the trenches 3902. In some embodiments, the second patterning process includes performing a wet etch process or some other suitable process. In various embodiments, the second patterning process includes exposing the second substrate 110 to tetramethyl ammonium hydroxide (TMAH) or some other suitable wet etchant. A removal process may be performed to remove the second hard mask layer 4002.

As shown in cross-sectional view 4100 of FIG. 41, a third hard mask layer 4102 is formed over the second substrate 110 and a third patterning process is performed on the second substrate 110 to expand the trenches 3902. In various embodiments, the trenches 3902 are defined by opposing sidewalls of the second substrate 110. In some embodiments, the third patterning process includes performing a wet etch process or some other suitable process. For example, the third patterning process includes exposing the second substrate 110 to TMAH or some other suitable wet etchant. A removal process may be performed to remove the third hard mask layer 4102 and the dielectric layer 3802 (not shown). Thus, in some embodiments, the plurality of trenches 3902 may be formed by: i) performing a dry etch (as shown in FIG. 39); ii) performing a first wet etch (as shown in FIG. 40); and iii) performing a second wet etch (as shown in FIG. 41).

As shown in cross-sectional view 4200 of FIG. 42, a doped capacitor region 116 and a well region 334 are formed in the second substrate 110. The doped capacitor region 116 lines the trenches 3902 and extends along a portion of the front-side surface **110*f* of the second substrate 110. In some embodiments, the doped capacitor region 116 and the well region 334 may be formed by the processes illustrated and/or described in FIGS. 17-20**.

As shown in cross-sectional view 4300 of FIG. 43, a plurality of pixel transistors 122-128 and a semiconductor capacitor 112 are formed on the second substrate 110. The semiconductor capacitor 112 comprises the doped capacitor region 116, a capacitor dielectric layer 118, and a first capacitor electrode 114. The first capacitor electrode 114 comprises a body structure **114*b* and a plurality of protrusions 114*p*. The plurality of protrusions 114*p* may have a triangle shape when viewed in cross-section. In some embodiments, the plurality of pixel transistors 122-128 and the semiconductor capacitor 112 may be formed by the processes illustrated and/or described in FIGS. 21-28**.

Figure 45:
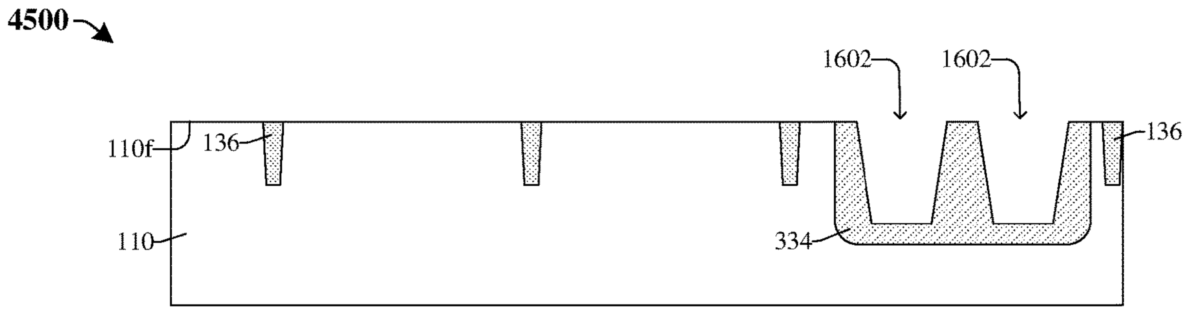
Figure 46:
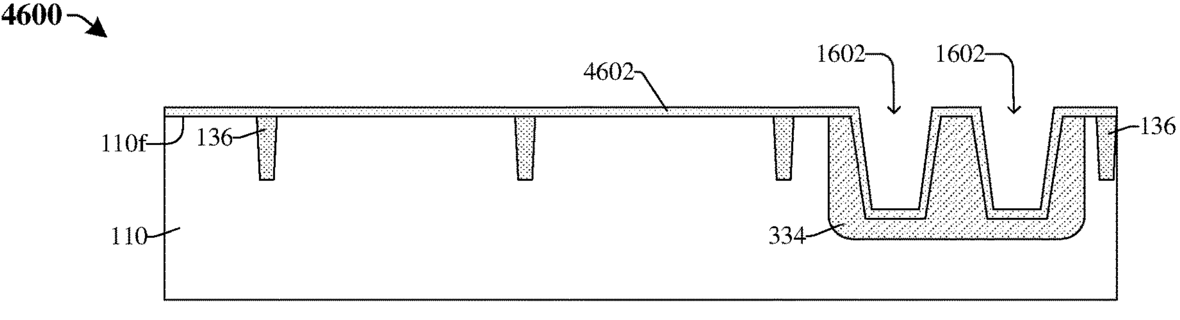
Figure 47:
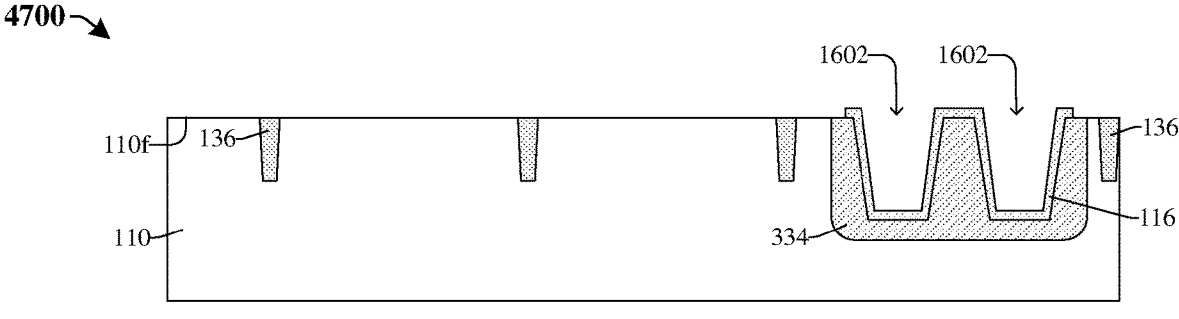

FIGS. 44-47 illustrate cross-sectional views 4400-4700 of some embodiments of acts that may be performed in place of the acts at FIGS. 14-20, such that the method of FIGS. 11-37 may alternatively proceed from FIGS. 11-13 to FIGS. 44-47, and then from FIG. 47 to FIGS. 21-37 (skipping FIGS. 14-20).

Although the cross-sectional views 4400-4700 shown in FIGS. 44-47 are described with reference to a method, it will be appreciated that the structures shown in FIGS. 44-47 are not limited to the method but rather may stand alone separate of the method. Furthermore, although FIGS. 44-47 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 44:
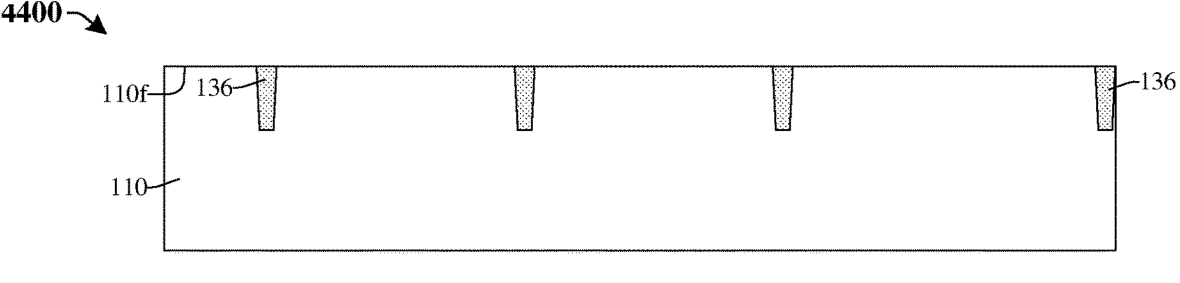
FIGS. 44-47 illustrate various cross-sectional views of some embodiments of a method of forming a doped capacitor region of a semiconductor capacitor of a pixel by epitaxy.

As shown in cross-sectional view 4400 of FIG. 44, a second substrate 110 is provided and an isolation structure 136 is formed in the second substrate 110. In some embodiments, the isolation structure 136 is formed as illustrated and/or described in FIG. 14.

As shown in cross-sectional view 4500 of FIG. 45, a plurality of trenches 1602 and a well region 334 are formed in the second substrate 110. In some embodiments, the trenches 1602 and the well region 334 may be formed as illustrated and/or described in FIGS. 15-17.

As shown in cross-sectional view 4600 of FIG. 46, a doped epitaxial layer 4602 is formed on the second substrate 110. The doped epitaxial layer 4602 extends along the front-side surface **110*f* of the second substrate 110 and lines the second substrate 110. The doped epitaxial layer 4602 is formed having the second doping type (e.g., n-type). The doped epitaxial layer 4602 may be deposited on the second substrate 110** by, for example, an epitaxial deposition process and may be in-situ doped with the second doping type (e.g., n-type) during the epitaxial deposition process.

As shown in cross-sectional view 4700 of FIG. 47, a patterning process is performed on the doped epitaxial layer (4602 of FIG. 46), thereby forming a doped capacitor region 116. The patterning process includes forming a masking layer (not shown) over the doped epitaxial layer (4602 of FIG. 46) and performing a dry etch process (e.g., a plasma etch, an ion beam etch, a reactive ion etch, etc.) or some other suitable etch process.

Figure 48:
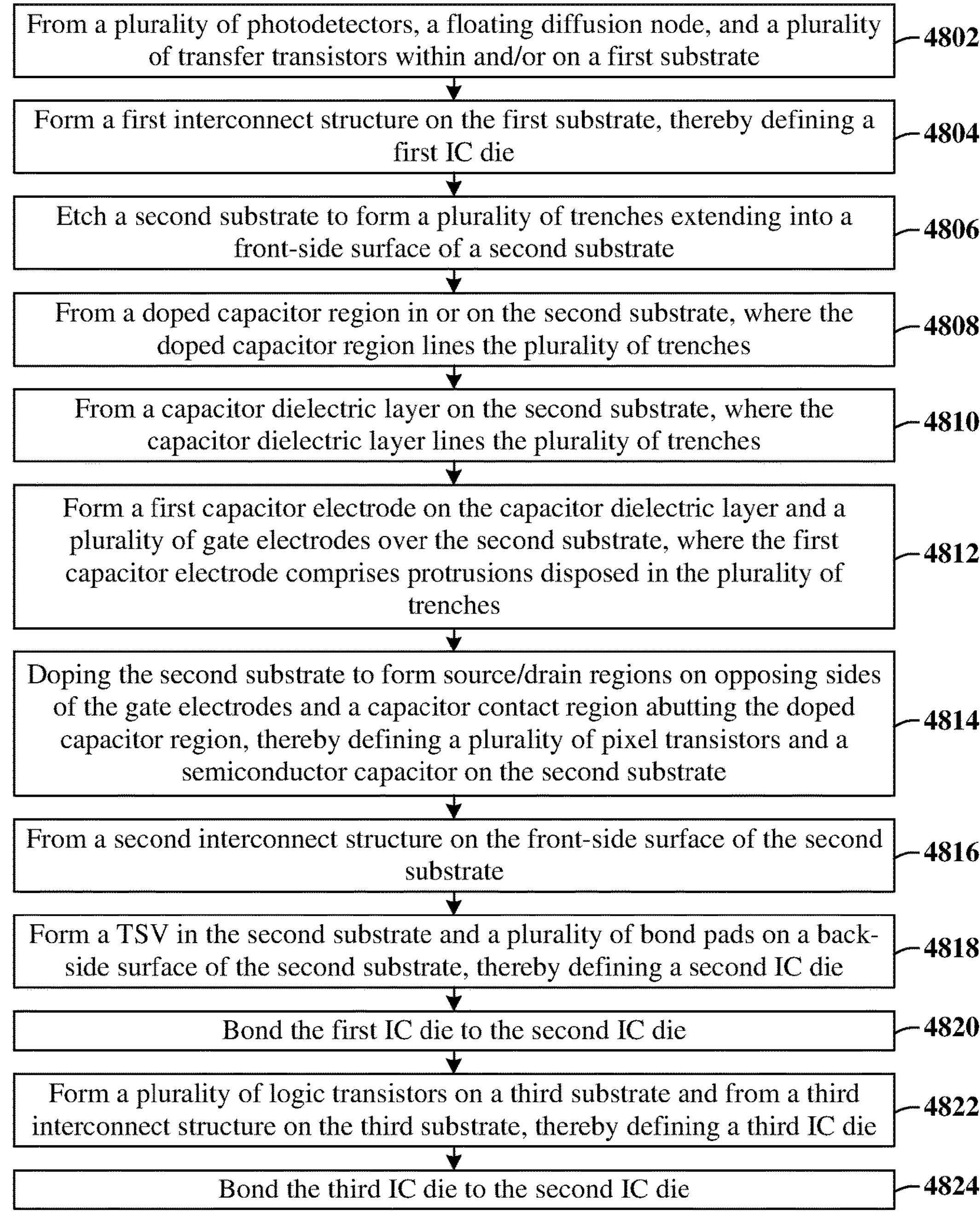
FIG. 48 illustrates a flowchart according to some embodiments of a method for forming an image sensor comprising a pixel having a semiconductor capacitor disposed on a substrate.

FIG. 48 illustrates some embodiments of a method 4800 for forming an image sensor comprising a pixel having a semiconductor capacitor disposed on a substrate. Although the method 4800 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 4802, a plurality of photodetectors, a floating diffusion node, and a plurality of transfer transistors are formed within and/or on a first substrate. FIG. 11 illustrates a cross-sectional view 1100 corresponding to some embodiments of act 4802.

At act 4804, a first interconnect structure is formed on the first substrate, thereby defining a first IC die. FIG. 12 illustrates a cross-sectional view 1200 corresponding to some embodiments of act 4804.

At act 4806, a second substrate is etched to form a plurality of trenches extending into a front-side surface of a second substrate. FIGS. 15-17 illustrate various cross-sectional views 1500-1700 corresponding to some embodiments of act 4806. FIGS. 38-41 illustrate various cross-sectional views 3800-4100 corresponding to some other embodiments of act 4806.

At act 4808, a doped capacitor region is formed in or on the second substrate, where the doped capacitor region lines the plurality of trenches. FIGS. 18-20 illustrate various cross-sectional views 1800-2000 corresponding to some embodiments of act 4808. FIG. 42 illustrates a cross-sectional view 4200 corresponding to some other embodiments of act 4808. FIGS. 46 and 47 illustrate various cross-sectional views 4600 and 4700 corresponding to further embodiments of act 4808.

At act 4810, a capacitor dielectric layer is formed on the second substrate, where the capacitor dielectric layer lines the plurality of trenches. FIG. 23 illustrates a cross-sectional view 2300 corresponding to some embodiments of act 4810.

At act 4812, a first capacitor electrode is formed on the capacitor dielectric layer and a plurality of gate electrodes over the second substrate, where the first capacitor electrode comprises protrusions disposed in the plurality of trenches. FIGS. 24-26 illustrate various cross-sectional views 2400-2600 corresponding to some embodiments of act 4812.

At act 4814, the second substrate is doped to from source/drain regions on opposing sides of the gate electrodes and a capacitor contact region abutting the doped capacitor region, thereby defining a plurality of pixel transistors and a semiconductor capacitor on the second substrate. FIG. 28 illustrates a cross-sectional view 2800 corresponding to some embodiments of act 4814.

At act 4816, a second interconnect structure is formed on the front-side surface of the second substrate. FIGS. 29-32 illustrate various cross-sectional views 2900-3200 corresponding to some embodiments of act 4816.

At act 4818, a TSV is formed in the second substrate and a plurality of bond pads are formed on a back-side surface of the second substrate, thereby defining a second IC die. FIGS. 33 and 34 illustrate cross-sectional views 3300 and 3400 corresponding to some embodiments of act 4818.

At act 4820, the first IC die is bonded to the second IC die. FIG. 35 illustrates a cross-sectional view 3500 corresponding to some embodiments of act 4820.

At act 4822, a plurality of logic transistors and a third interconnect structure are formed on a third substrate, thereby defining a third IC die. FIG. 36 illustrates a cross-sectional view 3600 corresponding to some embodiments of act 4822.

At act 4824, the third IC die is bonded to the second IC die. FIG. 36 illustrates a cross-sectional view 3600 corresponding to some embodiments of act 4824.

Accordingly, in some embodiments, the present disclosure relates to an image sensor comprising a pixel disposed across a first IC die and a second IC die, where a semiconductor capacitor is disposed within and/or on a substrate of the second IC die.

In some embodiments, the present application provides an image sensor including: a first integrated circuit (IC) die comprising a plurality of photodetectors disposed within a first substrate; a second IC die vertically stacked with the first IC die, wherein the second IC die comprises a plurality of pixel transistors and a semiconductor capacitor disposed on a second substrate, wherein the semiconductor capacitor comprises: a first capacitor electrode overlying the second substrate and comprising a protrusion disposed in the second substrate; a capacitor dielectric layer disposed between the first capacitor electrode and the second substrate; and a doped capacitor region disposed within the second substrate and underlying the first capacitor electrode; wherein the plurality of photodetectors, the plurality of pixel transistors, and the semiconductor capacitor define a pixel.

In some embodiments, the present application provides an image sensor including: a plurality of photodetectors and a floating diffusion node disposed within a first substrate, wherein the floating diffusion node is disposed between the photodetectors; a plurality of pixel transistors disposed on a second substrate under the first substrate, wherein the plurality of pixel transistors comprises a first pixel transistor having a first source/drain region directly electrically coupled to the floating diffusion node; and a semiconductor capacitor disposed on the second substrate, wherein the semiconductor capacitor comprises a doped capacitor region on the second substrate, a first capacitor electrode over the doped capacitor region, and a capacitor dielectric layer directly between the doped capacitor region and the first capacitor electrode, wherein the first capacitor electrode comprises a plurality of protrusions disposed in the second substrate, wherein the doped capacitor region continuously laterally wraps around the protrusions, and wherein the semiconductor capacitor is directly electrically coupled to a second source/drain region of the first pixel transistor.

In various embodiments, the present application provides a method for forming an image sensor, the method includes: forming a plurality of photodetectors and a floating diffusion node within a first substrate; etching a second substrate to form a plurality of trenches disposed in a front-side surface of the second substrate; forming a doped capacitor region on the second substrate, wherein the doped capacitor region extends along sidewalls of the second substrate defining the trenches; forming a capacitor dielectric layer over the doped capacitor region, wherein the capacitor dielectric layer lines the plurality of trenches; forming a first capacitor electrode on the capacitor dielectric layer, thereby defining a semiconductor capacitor, wherein the first capacitor electrode comprises a body structure over the second substrate and a plurality of protrusions disposed in the trenches; forming a plurality of pixel transistors on the second substrate, wherein the plurality of pixel transistors comprise gate electrodes over the second substrate; and bonding the second substrate to the first substrate, wherein a first transistor of the plurality of pixel transistors is electrically coupled between the floating diffusion node and the semiconductor capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, the method comprising:

forming a plurality of photodetectors and a floating diffusion node within a first substrate;

etching a second substrate to form a plurality of trenches disposed in a front-side surface of the second substrate;

forming a doped capacitor region on the second substrate, wherein the doped capacitor region extends along sidewalls of the second substrate defining the trenches;

forming a capacitor dielectric layer over the doped capacitor region, wherein the capacitor dielectric layer lines the plurality of trenches;

forming a first capacitor electrode on the capacitor dielectric layer, thereby defining a semiconductor capacitor, wherein the first capacitor electrode comprises a body structure over the second substrate and a plurality of protrusions disposed in the trenches;

forming a plurality of pixel transistors on the second substrate, wherein the plurality of pixel transistors comprise gate electrodes over the second substrate; and bonding the second substrate to the first substrate, wherein a first transistor of the plurality of pixel transistors is electrically coupled between the floating diffusion node and the semiconductor capacitor.

2. The method of claim 1, wherein the gate electrodes and the first capacitor electrode are formed concurrently with one another.

3. The method of claim 1, wherein forming the doped capacitor region comprises performing a doping process on the second substrate to implant dopants in the second substrate along sidewalls of the second substrate defining the trenches.

4. The method of claim 1, wherein forming the doped capacitor region comprises depositing a doped epitaxial layer lining the trenches and performing an etching process on the doped epitaxial layer.

5. The method of claim 1, further comprising:

performing a doping process to form a plurality of source/drain regions on opposing sides of the gate electrodes and a capacitor contact region next to the doped capacitor region.

6. A method for forming an image sensor, comprising:

forming a plurality of photodetectors of a pixel in a first substrate;

performing a patterning process on a second substrate having a first doping type to form a plurality of trenches in the second substrate;

forming a well region having the first doping type around the plurality of trenches;

forming a doped capacitor region of a capacitor lining the plurality of trenches and having a second doping type with a higher doping concentration than the well region, wherein the second doping type is different from the first doping type;

forming a capacitor dielectric layer over the doped capacitor region and lining the plurality of trenches;

forming a conductive material comprising a body structure overlying a first surface of the second substrate and a plurality of protrusions extending into the plurality of trenches;

etching the conductive material to form a capacitor electrode of the capacitor over the doped capacitor region;

forming a transistor on the first surface of the second substrate, wherein the transistor comprises a gate electrode and a gate dielectric layer between the gate electrode and the second substrate; and bonding the first substrate to the second substrate, wherein the pixel comprises the transistor and the capacitor.

7. The method of claim 6, wherein the capacitor dielectric layer and the gate dielectric layer both comprise a first material.

8. The method of claim 6, wherein the patterning process comprises:

forming a hard mask over the first surface of the second substrate;

performing a first etch according to the hard mask to form a plurality of openings in the second substrate; and performing a second etch to expand the plurality of openings and form the plurality of trenches, wherein the first etch is different from the second etch.

9. The method of claim 6, wherein forming the transistor comprises forming a pair of source/drain regions having the second doping type in the second substrate on opposing sides of the gate electrode.

10. The method of claim 9, further comprising:

forming a capacitor contact region having the second doping type and abutting the doped capacitor region, wherein the capacitor contact region has a higher doping concentration than the doped capacitor region and is formed concurrently with the pair of source/drain regions.

11. The method of claim 6, wherein the gate electrode is formed concurrently with the capacitor electrode, wherein a top surface of the gate electrode is vertically aligned with a top surface of the capacitor electrode.

12. The method of claim 6, further comprising:

forming a floating diffusion node of the pixel in the first substrate and proximate to the plurality of photodetectors;

forming a plurality of transfer transistors of the pixel on the first substrate and proximate to the floating diffusion node, wherein the plurality of transfer transistors are configured to electrically couple the plurality of photodetectors to the floating diffusion node; and forming an interconnect structure over the first surface of the second substrate, wherein the interconnect structure is between the first substrate and the second substrate, wherein the interconnect structure comprises a plurality of conductive structures which couple the doped capacitor region to the transistor and the transistor to the floating diffusion node.

13. The method of claim 6, wherein a width of an individual trench in the plurality of trenches is greater than a lateral spacing between a pair of adjacent trenches in the plurality of trenches.

14. The method of claim 6, wherein the plurality of trenches are elongated in a first direction and laterally spaced in a second direction when viewed from a top view.

15. A method for forming an image sensor comprising:

forming a plurality of photodetectors and a floating diffusion node in a first substrate;

etching a second substrate to form a plurality of trenches in the second substrate;

forming a doped capacitor region lining the plurality of trenches;

forming a gate dielectric layer on a region of a first surface of the second substrate laterally offset from the plurality of trenches;

forming a capacitor dielectric layer lining the plurality of trenches;

depositing a conductive material over the gate dielectric layer and the capacitor dielectric layer;

performing a patterning process on the conductive material, the gate dielectric layer, and the capacitor dielectric layer, thereby forming a semiconductor capacitor and a plurality of gate structures, wherein the gate structures comprise corresponding gate electrodes and gate dielectrics;

forming a plurality of source/drain regions in the second substrate and under the plurality of gate structures; and bonding the second substrate to the first substrate, wherein a bond interface is between the first and second substrates.

16. The method of claim 15, wherein a transistor comprises a first gate structure in the plurality of gate structures and a pair of source/drain regions in the plurality of source/drain regions, wherein the transistor is electrically coupled to the floating diffusion node via the bond interface and is electrically coupled to the semiconductor capacitor.

17. The method of claim 16, wherein forming the doped capacitor region comprises forming a doped epitaxial layer on the first surface of the second substrate and in the plurality of trenches, wherein a thickness of the doped epitaxial layer is greater than a thickness of the capacitor dielectric layer.

18. The method of claim 15, wherein the trenches form a 2-dimensional array comprising a plurality of rows and a plurality of columns when viewed from a top view.

19. The method of claim 15, further comprising:

forming a first dielectric structure on a first surface of the first substrate;

forming a first interconnect structure in the first dielectric structure;

forming a second dielectric structure on the first surface of the second substrate; and forming a second interconnect structure in the second dielectric structure, wherein the second interconnect structure couples the semiconductor capacitor to one or more of the plurality of source/drain regions, wherein the first interconnect structure is coupled to the second interconnect structure at the bond interface.

20. The method of claim 19, further comprising:

forming a through substrate via (TSV) in the second substrate, wherein the TSV is coupled to the second interconnect structure;

forming a plurality of bond pads on a second surface of the second substrate opposite the first surface of the second substrate, wherein at least one of the plurality of bond pads is coupled to the TSV; and bonding an integrated circuit (IC) die to the plurality of bond pads.

* * * * *